(12) United States Patent
Yamano et al.

(10) Patent No.: US 7,906,833 B2
(45) Date of Patent: Mar. 15, 2011

(54) SEMICONDUCTOR DEVICE AND MANUFACTURING METHOD THEREOF

(75) Inventors: Takaharu Yamano, Nagano (JP); Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/273,901

(22) Filed: Nov. 19, 2008

(65) Prior Publication Data

US 2009/0127665 A1    May 21, 2009

(30) Foreign Application Priority Data

Nov. 20, 2007   (JP) ................................ 2007-300790

(51) Int. Cl.
    *H01L 23/544*    (2006.01)
(52) U.S. Cl. ......... 257/620; 257/734; 257/737; 257/772; 257/787; 257/E23.179
(58) Field of Classification Search .................. 438/113, 438/114, 462; 257/620
    See application file for complete search history.

(56) References Cited

U.S. PATENT DOCUMENTS

| | | | | |
|---|---|---|---|---|
| 2002/0008320 A1* | 1/2002 | Kuwabara et al. | ............ | 257/738 |
| 2002/0025655 A1* | 2/2002 | Satoh et al. | .................... | 438/460 |
| 2004/0032026 A1* | 2/2004 | Yang et al. | .................... | 257/734 |
| 2004/0115868 A1* | 6/2004 | Ono | ................. | 438/127 |
| 2004/0115902 A1* | 6/2004 | Hanaoka | ........................ | 438/460 |
| 2007/0007664 A1* | 1/2007 | Lee et al. | ........................ | 257/779 |

FOREIGN PATENT DOCUMENTS

| | | |
|---|---|---|
| JP | 09-064069 | 3/1997 |
| JP | 2002-313985 | 10/2002 |
| JP | 2002-329809 | 11/2002 |

* cited by examiner

*Primary Examiner* — Angel Roman
(74) *Attorney, Agent, or Firm* — Rankin, Hill & Clark LLP

(57) ABSTRACT

A method for manufacturing a semiconductor device has preparation step of preparing a semiconductor substrate having a plurality of semiconductor chip formation regions and a scribe region arranged between the plurality of the semiconductor chip formation regions and including a substrate cutting position, a semiconductor chip formation step of forming semiconductor chips having electrode pads on the plurality of semiconductor chip formation regions, a first insulation layer formation step of forming a first insulation layer on the semiconductor chips and the scribe region of the semiconductor substrate, a second insulation layer formation step of forming a second insulation layer on the first insulation layer except for a region corresponding to the substrate cutting position, and a cutting step of cutting the semiconductor substrate at the substrate cutting position.

3 Claims, 28 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. More particularly, it relates to a semiconductor device which is generally equal in size to a semiconductor chip in plan configuration, and in which the semiconductor chip is flip-chip connected to a wiring pattern, and a manufacturing method thereof.

2. Description of Related Art

In recent years, semiconductor applied products have rapidly advanced in size reduction, thickness reduction, and weight reduction as various mobile devices such as digital cameras and cellular phones. Accordingly, a semiconductor device has been also required to be reduced in size, and increased in density. Thus, there has been developed a semiconductor device (see, e.g., FIG. 1) referred to as a so-called chip size package (CSP) configured to be generally equal in size to a semiconductor chip thereof in plan configuration, and there have been proposed various manufacturing methods.

A conventional semiconductor device 100 which is so-called this chip size package will be explained. FIG. 1 is a sectional view of the conventional semiconductor device 100.

The semiconductor device 100 includes a semiconductor chip 101, internal connection terminal 102, a resin layer 103, a wiring pattern 104, a solder resist 106 and an external connection terminal 107.

The semiconductor chip 101 has a semiconductor substrate 109, a semiconductor integrated circuit 111, an electrode pad 112 and a protective film 113. The semiconductor substrate 109 is, for example, a laminated and divided Si wafer.

The semiconductor integrated circuit 111 is provided on one surface of the semiconductor substrate 109 shown in FIG. 2. The electrode pad 112 is provided on the semiconductor integrated circuit 111 and is electrically connected with wires provided on the semiconductor integrated circuit 111. The protective film 113 is provided on the semiconductor integrated circuit 111 and protects the semiconductor integrated circuit 111.

The resin layer 103 is provided so as to cover the protective film 113 provided on the semiconductor integrated circuit 111.

The wiring pattern 104 is formed on the resin layer 103 and has an external connection terminal provision region 104A on which the external connection terminal 107 is provided.

The internal connection terminal 102 penetrates the resin film 103 and electrically connects the electrode pad 112 provided on the semiconductor integrated circuit 111 with the wiring pattern 104 provided on the resin layer 103.

The solder resist 106 is provided so as to cover the wiring pattern 104 except for the external connection terminal provision region 104A. The external connection terminal 107 is provided on the external connection terminal provision region 104A on the wiring pattern 104.

This semiconductor device 100 is manufactured by following steps (a) through (g).

(a) Forming plurality of the semiconductor integrated circuits 111, the electrode pads 112, the protective films 113 on one semiconductor substrate 110.

(b) Forming the resin layer 103 on a substantially whole surface of the semiconductor substrate 110 except for the electrode pads 112.

(c) Forming the internal connection terminals 102 on the electrode pads 112.

(d) Forming the wiring patterns 104 on the resin layer 103 and the electrode pad 112.

(e) Forming the solder resist 106 on the substantially whole surface of the resin layer 103 so as to cover the wiring pattern 104 except for the region to be connected to the external connection terminal 107.

(f) Forming the external connection terminal 107 on the region where the wiring pattern 104 is exposed from the solder resist 106.

(g) Cutting the semiconductor substrate 110 passed through the steps (a) through (f) and dividing into the respective semiconductor chips 101. For example, as shown in FIG. 2, the semiconductor substrate 110 is divided into respective semiconductor chips 101 by cutting a scribe region B by moving the dicing blade along with a scribe line C.

When using the semiconductor device 100 obtained by the above described method, the semiconductor device 100 is heated while using and after that, is gradually cooled. In accordance with this heating/cooling cycle, the semiconductor device 100 thermally expands or thermally contracts. Generally, since the semiconductor chip 101 is made of silicon, the resin layer 103 is made of resin such as polyimide resin and thermosetting epoxy resin, and the solder resist 106 is made of resin such as epoxy resin and epoxyacrylate resin, when the semiconductor device 100 is heated or cooled, the respective layers 101, 103 and 106 expands or contracts in accordance with respective materially intrinsic coefficient of thermal expansion.

Further, since there is large difference in the coefficient of the thermal expansion between the silicon and the resin, in accordance with the heating and the cooling, the dimension of the semiconductor chip 101 made of silicon changes from the dimension of the resin layer 103 and the solder resist 106 which are made of resin.

This dimensional change generates a stress which causes a peeling of the resin layer 103 from the semiconductor chip 101. Thus, this repetitive stress caused by using of the semiconductor device 100 invites a peeling of the resin layer 103 from the semiconductor chip 101.

Generally, since the bonding force of the resin layer 103 to the semiconductor chip 101 becomes the weakest at a corner portion and the stress due to the dimensional change becomes the strongest at the same corner portion, the peeling of the resin layer 103 starts from the corner portion of the semiconductor chip 101.

Thus, there is a problem that a reliability of the semiconductor device 100 deteriorates due to the peeling of the resin layer 103 from the corner portion.

Note that when using the thermosetting resin as the solder resist, at the time of manufacturing the semiconductor device 100, accompanying with the hardening of the solder resist, contraction is caused and the dimensional change is also generated in manufacturing the semiconductor device 100. Thus, the peeling of the resist film 103 can be generated even if manufacturing the semiconductor device 100.

SUMMARY OF THE INVENTION

The present invention is achieved in view of the circumstance and an object of the present invention is to provide a semiconductor device having enhanced reliability and also to provide a manufacturing method thereof.

In order to attain the foregoing object, according to a first aspect of the invention, there is provided a method for manufacturing a semiconductor device, including:

preparation step of preparing a semiconductor substrate including:
  a plurality of semiconductor chip formation regions and
  a scribe region arranged between the plurality of the semiconductor chip formation regions and including a substrate cutting position;
a semiconductor chip formation step of forming semiconductor chips having electrode pads on the plurality of semiconductor chip formation regions;
a first insulation layer formation step of forming a first insulation layer on the semiconductor chips and the scribe region of the semiconductor substrate;
a second insulation layer formation step of forming a second insulation layer on the first insulation layer except for a region corresponding to the substrate cutting position; and
a cutting step of cutting the semiconductor substrate at the substrate cutting position.

According to a second aspect of the invention as set forth in the first aspect of the invention, the method further including:
an internal connection terminal formation step of forming an internal connection terminal on the electrode pad after the semiconductor chip formation step;
a metal layer formation step of forming a metal layer to be electrically connected to the internal connection terminals on the first insulation layer after the first insulation layer formation step;
a wiring pattern formation step of etching the metal layer, and forming a wiring pattern; and
an external connection terminal formation step of forming an external connection terminal to be electrically connected to the wiring pattern in a predetermined region of the wiring pattern.

According to a third aspect of the invention, as set forth in the first or second aspect of the invention, the first insulation layer does not expose the semiconductor chips corresponding to the scribe region.

According to a fourth aspect of the invention, as set forth in any one of the first to third aspects of the invention, the first insulation layer is made of a non light-sensitive insulation material.

According to a fifth aspect of the invention as set forth in any one of the first to second aspect of the invention, the second insulation layer is formed by a photolithography method including an etching processing step.

According to a sixth aspect of the invention, there is provided a semiconductor device, including:
  a semiconductor substrate including:
    a plurality of semiconductor chip formation regions; and
    a scribe region arranged between the plurality of the semiconductor chip formation regions and including a substrate cutting position;
  a semiconductor chip including an electrode pad and provided on the semiconductor chip formation region;
  a first insulation layer provided on the semiconductor substrate; and
  a second insulation layer having an opening and provided on the first insulation layer, wherein
  a part of the first insulation layer corresponding to the substrate cutting position of the semiconductor substrate is exposed through the opening of the second insulation layer.

According to a seventh aspect of the invention, as set forth in the sixth aspect of the invention, the semiconductor device further including:
  an internal connection terminal provided on the electrode pad;
  a wiring pattern provided on the first insulation layer and including a metal layer to be electrically connected to the internal connection terminals; and
  an external connection terminal to be electrically connected to the wiring pattern.

According to an eighth aspect of the invention as set forth in the sixth or seventh aspect of the invention, wherein the first insulation layer does not expose the semiconductor chips corresponding to the scribe region.

According to a ninth aspect of the invention as set forth in any one of the sixth to eighth aspects of the invention the first insulation layer is made of a non light-sensitive insulation material.

In accordance with the invention, it is possible to provide a semiconductor device and a manufacturing method thereof, capable of reducing the manufacturing cost of the semiconductor device, and capable of improving the yield and reliability of the semiconductor device.

DETAILED DESCRIPTION OF EXEMPLARY EMBODIMENTS OF THE PRESENT INVENTION

Hereinafter, by reference to the accompanying drawings, a description will be given to exemplary embodiments of the invention.

First Embodiment

Figure 1:
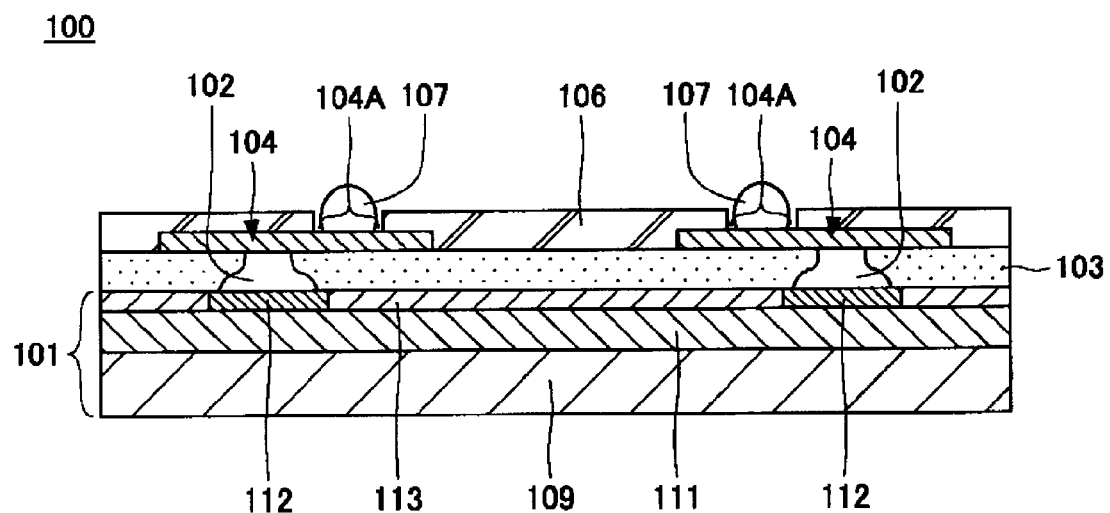
FIG. 1 is a cross sectional view of a conventional semiconductor device.
Figure 2:
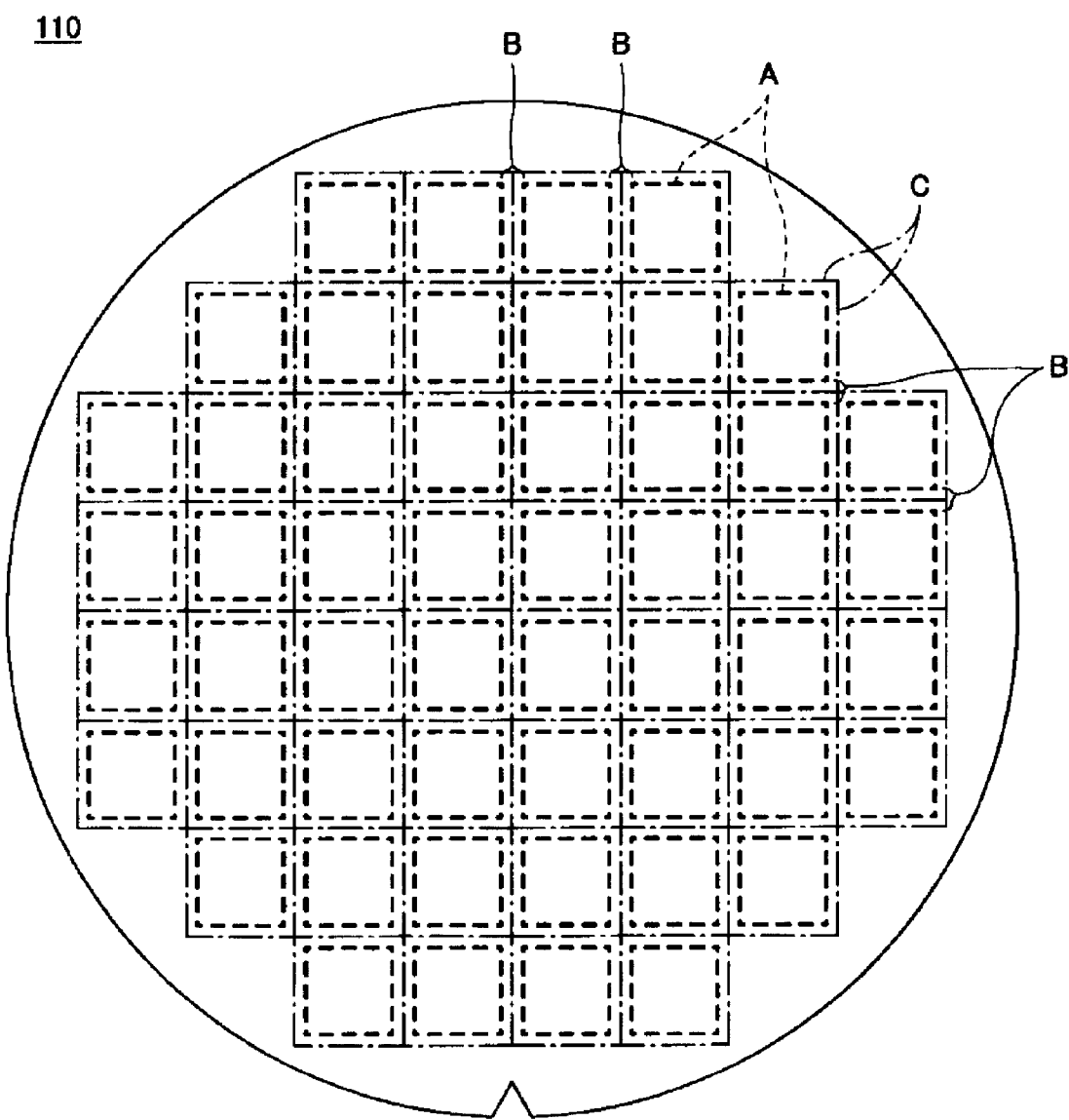
FIG. 2 is a plane view of a conventional semiconductor substrate.
Figure 3:
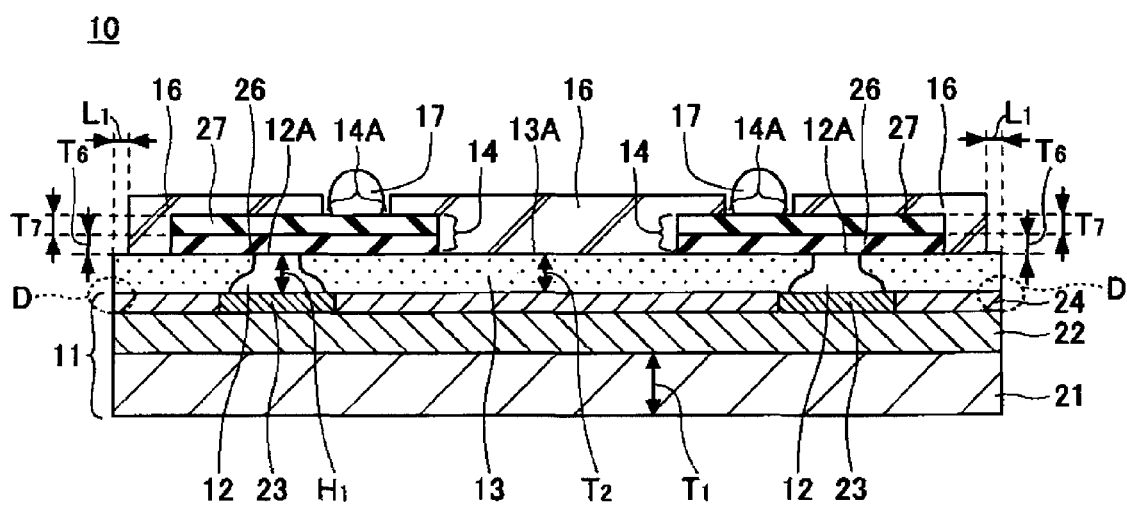
FIG. 3 is a cross sectional view of a semiconductor device of a first embodiment of the invention.

FIG. 3 is a cross sectional view of a semiconductor device of a first embodiment of the invention. As shown in FIG. 3, a semiconductor device 10 of the first embodiment has a semiconductor chip 11, internal connection terminals 12, an insulation layer 13 (first insulation layer), a wiring pattern 14 including a metal layer 26 and a second metal layer 27, a solder resist 16 (second insulation layer), and external connection terminals 17. Here, a D part denotes a portion where a peeling off is unfavorably caused in a conventional semiconductor device. That is, a boundary between a protective layer 24 and the first insulation layer 13, which adjoins to a scribe region B explained later.

Figure 4:
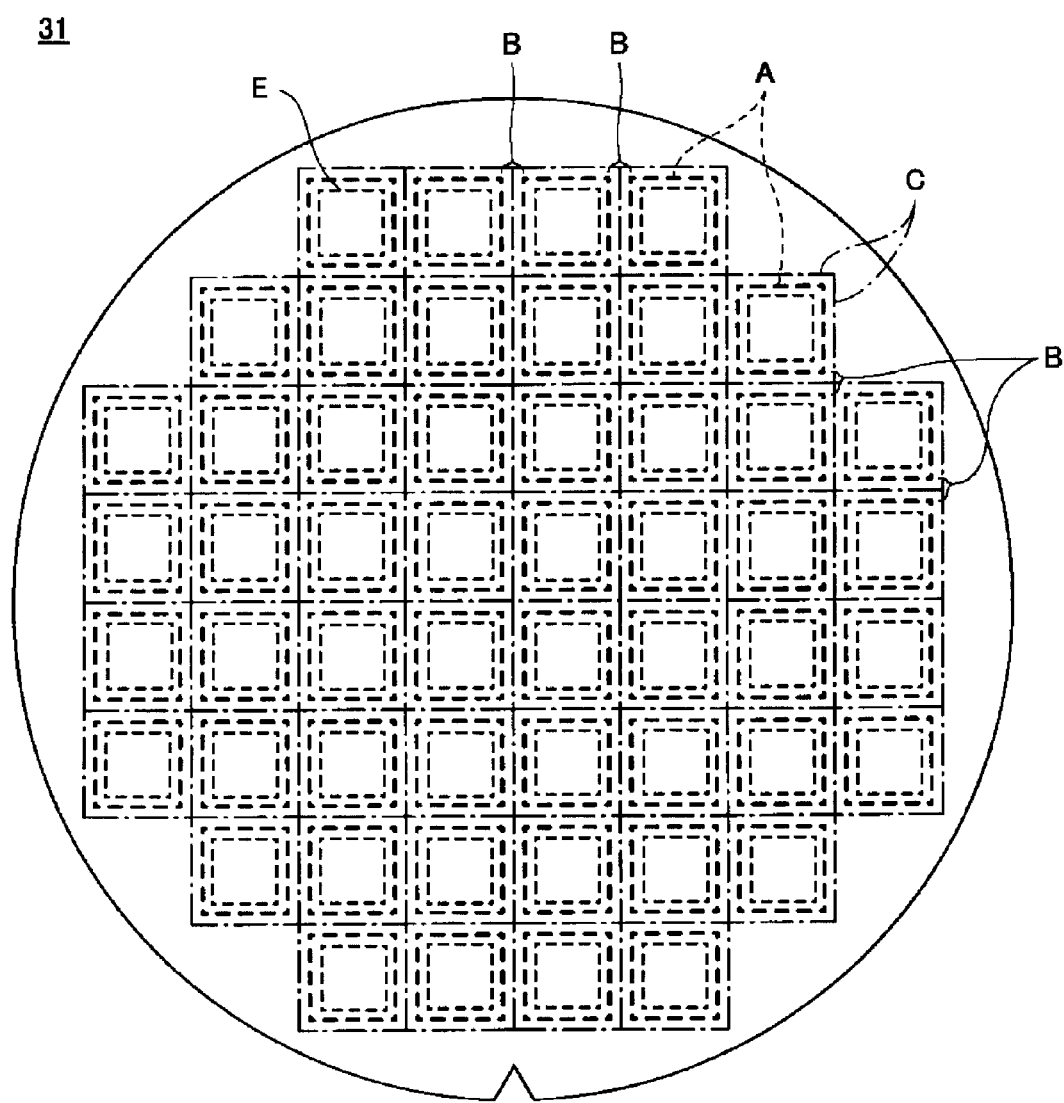
FIG. 4 is a plan view of a semiconductor substrate.

FIG. 4 is a plan view of a semiconductor substrate on which the semiconductor devices of the first embodiment of the invention are formed. In FIG. 4, 31 denotes a semiconductor substrate, and C denotes a position at which the semiconductor substrate 31 is cut by a dicer (which is hereinafter referred to as a "substrate cutting position C"). The semiconductor substrate 31 has a plurality of semiconductor device formation regions A, and a scribe region B including the substrate cutting position C, for separating a plurality of the semiconductor device formation regions A each other. A plurality of the semiconductor device formation regions A are the regions where the semiconductor devices 10 are formed. The semiconductor substrate 31 is a substrate which is laminated, and cut at the substrate cutting position C, thereby to be formed into a semiconductor substrate 21 shown in FIG. 3.

In FIG. 3, the semiconductor chip 11 has a semiconductor substrate 21, a semiconductor integrated circuit 22, a plurality of electrode pads 23, and a protective layer 24. The semiconductor substrate 21 is a substrate for forming the semiconductor integrated circuit 22. The semiconductor substrate 21 has been laminated. The thickness $T_1$ of the semiconductor substrate 21 can be set at, for example, 100 μm to 300 μm. The semiconductor substrate 21 is, for example, each individual piece obtained by cutting a laminated Si wafer.

The semiconductor integrated circuit 22 is provided on the front surface side of the semiconductor substrate 21. The semiconductor integrated circuit 22 includes a diffusion layer (not shown) formed in the semiconductor substrate 21, an insulation layer (not shown) stacked on the semiconductor substrate 21, vias (not shown) provided in the stacked insulation layer, and wiring, and the like (not shown).

A plurality of the electrode pads 23 are provided on the semiconductor integrated circuit 22. The electrode pads 23 are electrically connected to the wiring (not shown) provided on the semiconductor integrated circuit 22. As the material for the electrode pads 23, for example, Al can be used.

The protective film 24 is provided on the semiconductor integrated circuit 22. The protective film 24 protects the semiconductor integrated circuit 22. As the protective film 24, for example, a SiN film, a PSG (phosphor silicate glass) film, or the like can be used. Alternatively, it is also acceptable that a layer including polyimide or the like is further stacked on a layer including a SiN film, a PSG film, or the like.

Each internal connection terminal 12 is provided on each electrode pad 23. The internal connection terminal 12 is for electrically connecting the semiconductor integrated circuit 22 and the wiring pattern 14. The height $H_1$ of the internal connection terminal 12 can be set at, for example, 10 μm to 60 μm. As the internal connection terminal 12, for example, there can be used an Au bump, an Au plated film, or a metal film including a Ni film formed by an electroless plating process, and an Au film covering it. The Au bump can be formed by, for example, a bonding process or a plating process.

The insulation layer 13 (first insulation layer) is provided so as to cover the internal connection terminal 12 portions except for the top surfaces 12A of the internal connection terminals 12, and the semiconductor chips 11. The top surfaces 12A of the internal connection terminals 12 are exposed from the insulation layer 13. The top surface 13A of the insulation layer 13 is set generally flush with the top surfaces 12A of the internal connection terminals 12. As the insulation layer 13, there can be used, for example, a sheet-like insulation layer having adherence (e.g., NCF (Non Conductive Film)), or a paste-like insulation layer (e.g., NCP (Non Conductive Paste)). The thickness $T_2$ of the insulation layer 13 can be set at, for example, 10 μm to 60 μm.

The wiring pattern 14 includes the metal layer 26 and the second metal layer 27, and provided on the top surface 13A of the insulation layer 13 so as to be in contact with the top surfaces 12A of the internal connection terminals 12. The wiring pattern 14 is electrically connected to the semiconductor integrated circuit 22 via the internal connection terminals 12. The wiring pattern 14 has an external connection terminal provision region 14A in which the external connection terminals 17 are provided. As the material for the wiring pattern 14, for example, Cu can be used. The thickness of the wiring pattern 14 can be set at, for example, 12 μm.

The solder resist 16 (second insulation layer) is provided so as to be opened at the external connection terminal provision region 14A and at the whole of, or a part of the scribe region B, and to cover the wiring pattern 14. Incidentally, the solder resist 16 at the portion corresponding to the substrate cutting position C is necessarily opened. The external connection terminals 17 are provided in the external connection terminal provision region 14A of the wiring pattern 14. The external connection terminals 17 are terminals to be electrically connected to the pads provided on a mounting substrate (not shown) such as a motherboard. As the external connection terminals 17, for example, solder bumps can be used.

Here, on the whole of, or a part of the scribe region B of the semiconductor device 10, the solder resist 16 is not formed. The solder resist 16 at the portion corresponding to the substrate cutting position C is necessarily opened. Thus, when the semiconductor device 31 is cut at the substrate cutting position C, the semiconductor chips 11 and the insulation layer 13 are cut, but the solder resist 16 is not cut. Therefore, the insulation layer 13 is exposed at the outer periphery of the semiconductor device 10 (the main surface of the semiconductor chip 11 is not exposed). The cut plane of the insulation layer 13 and the end face of the solder resist 16 have a certain distance $L_1$ therebetween.

As described above, the solder resist 16 is not formed on the whole of, or a part of the scribe region, and the solder resist 16 at the portion corresponding to the substrate cutting position C is necessarily opened. Therefore, the cut surface of the insulation layer 13 and the end face of the solder resist 16 have a certain distance $L_1$ therebetween, which enables the reduction of the effects of tensile stress and hardening shrinkage force exerted on the D part (releasing of the stress applied on the D part) by the solder resist 16. This can prevent the peeling off of the insulation layer from the semiconductor chips 11.

FIGS. 5 to 20 are views showing the manufacturing steps of the semiconductor device in accordance with the first embodiment of the invention. In FIGS. 5 to 20, the same constituent parts as those of the semiconductor device 10 of the first embodiment are given the same reference numerals and signs. In FIGS. 5 to 20, C denotes a position at which the semiconductor substrate 31 is cut by a dicer (which is hereinafter referred to as a "substrate cutting position C"); A denotes a plurality of semiconductor device formation regions (which are hereinafter referred to as "semiconductor device formation regions A"; and B denotes a scribe region B including the substrate cutting position C, for separating a plurality of the semiconductor device formation regions A (which is hereinafter referred to as a "scribe region B").

Figure 5:
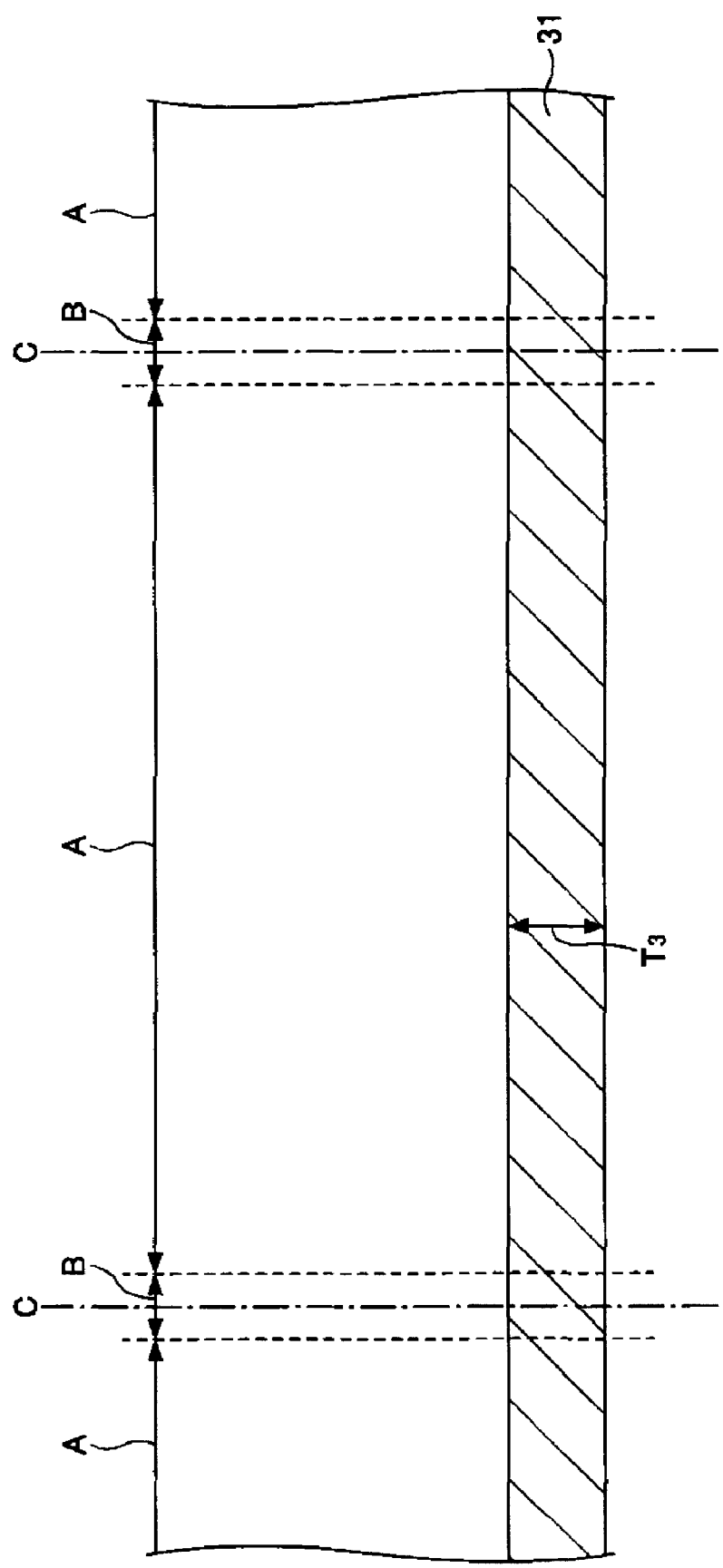
FIG. 5 is a view (the first) showing a manufacturing step of the semiconductor device of the first embodiment of the invention.

First, in the step shown in FIG. 5, there is prepared the semiconductor substrate 31 having a plurality of the semiconductor device formation regions A, and a scribe region B including the substrate cutting position C, for separating a plurality of the semiconductor device formation regions A (see FIG. 4). The semiconductor substrate 31 is laminated, and cut at the substrate cutting position C, thereby to be formed into the semiconductor substrate 21 described previously (see FIG. 3). As the semiconductor substrate 31, for example, a Si wafer can be used. The thickness $T_3$ of the semiconductor substrate 31 can be set at, for example, 500 μm to 775 μm.

Figure 6:
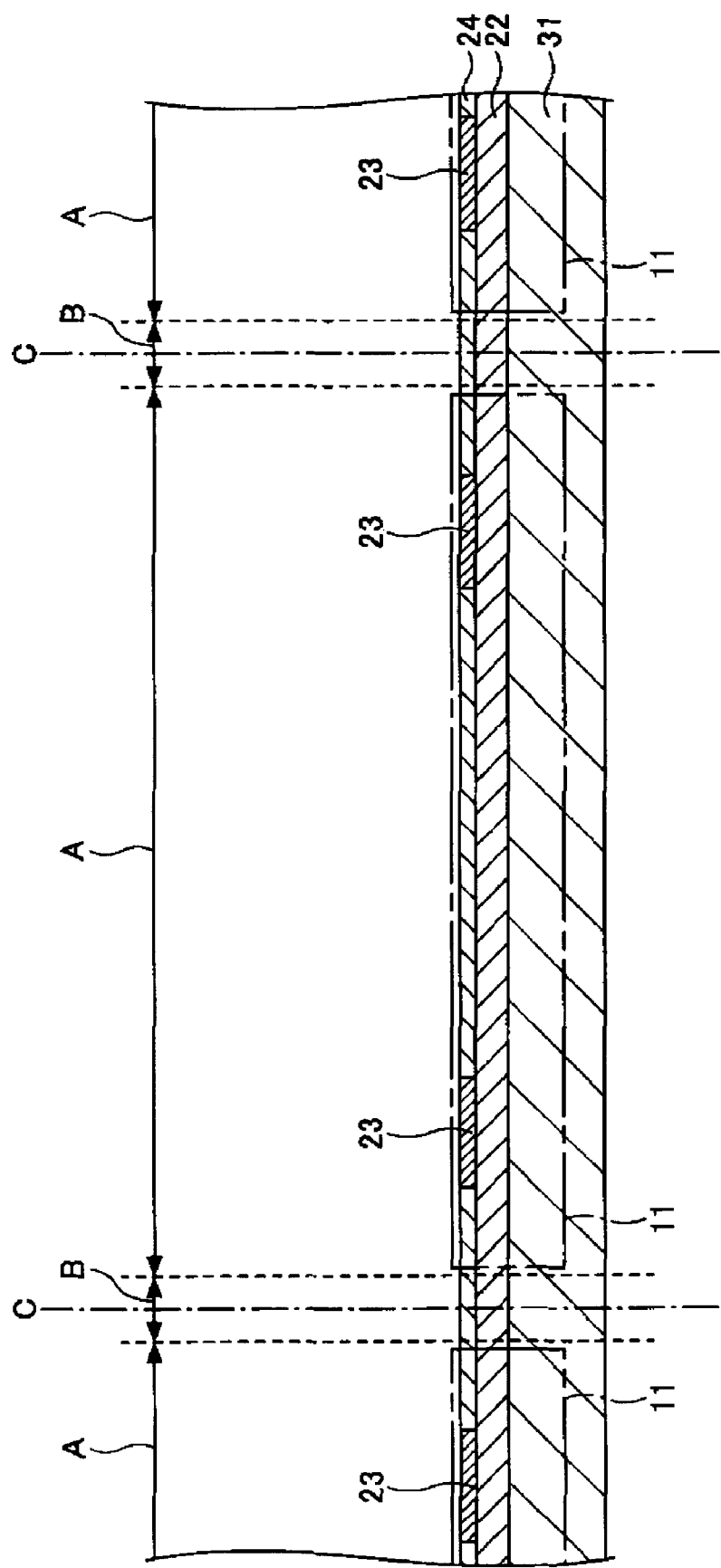
FIG. 6 is a view (the second) showing a manufacturing step of the semiconductor device of the first embodiment of the invention.

Then, in the step shown in FIG. 6, on the front surface side of the semiconductor substrate 31 corresponding to the semiconductor device formation regions A, the semiconductor chip 11 having the semiconductor integrated circuit 22, the electrode pads 23, and the protective layer 24 is formed by a known method (semiconductor chip formation step). As the material for the electrode pads 23, for example, Al can be used. As the protective film 24, for example, a SiN film or a PSG film can be used. Alternatively, it is also acceptable that a layer including polyimide or the like is further stacked on a layer including a SiN film, a PSG film, or the like.

Figure 7:
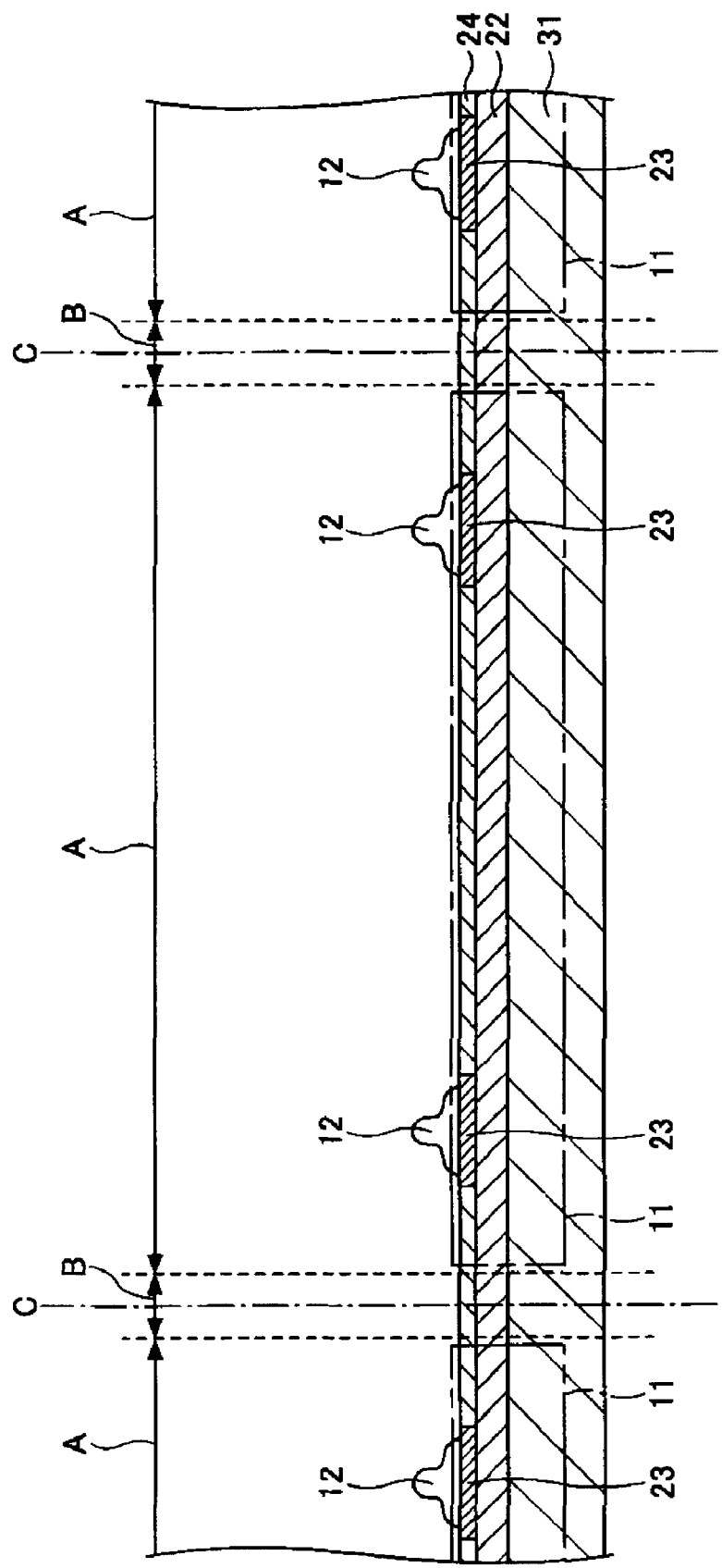
FIG. 7 is a view (the third) showing a manufacturing step of the semiconductor device of the first embodiment of the invention.

Then, in the step shown in FIG. 7, the internal connection terminals 12 are formed on a plurality of the electrode pads 23 provided in a plurality of the semiconductor device formation regions A, respectively (internal connection terminal formation step). As each internal connection terminal 12, for example, there can be used an Au bump, an Au plated film, or a metal film including a Ni film formed by an electroless plating process and an Au film stacked on the Ni film. The Au bump can be formed by, for example, a bonding process. Incidentally, the height of a plurality of the internal connection terminals 12 formed in the step shown in FIG. 7 have deviations.

Figure 8:
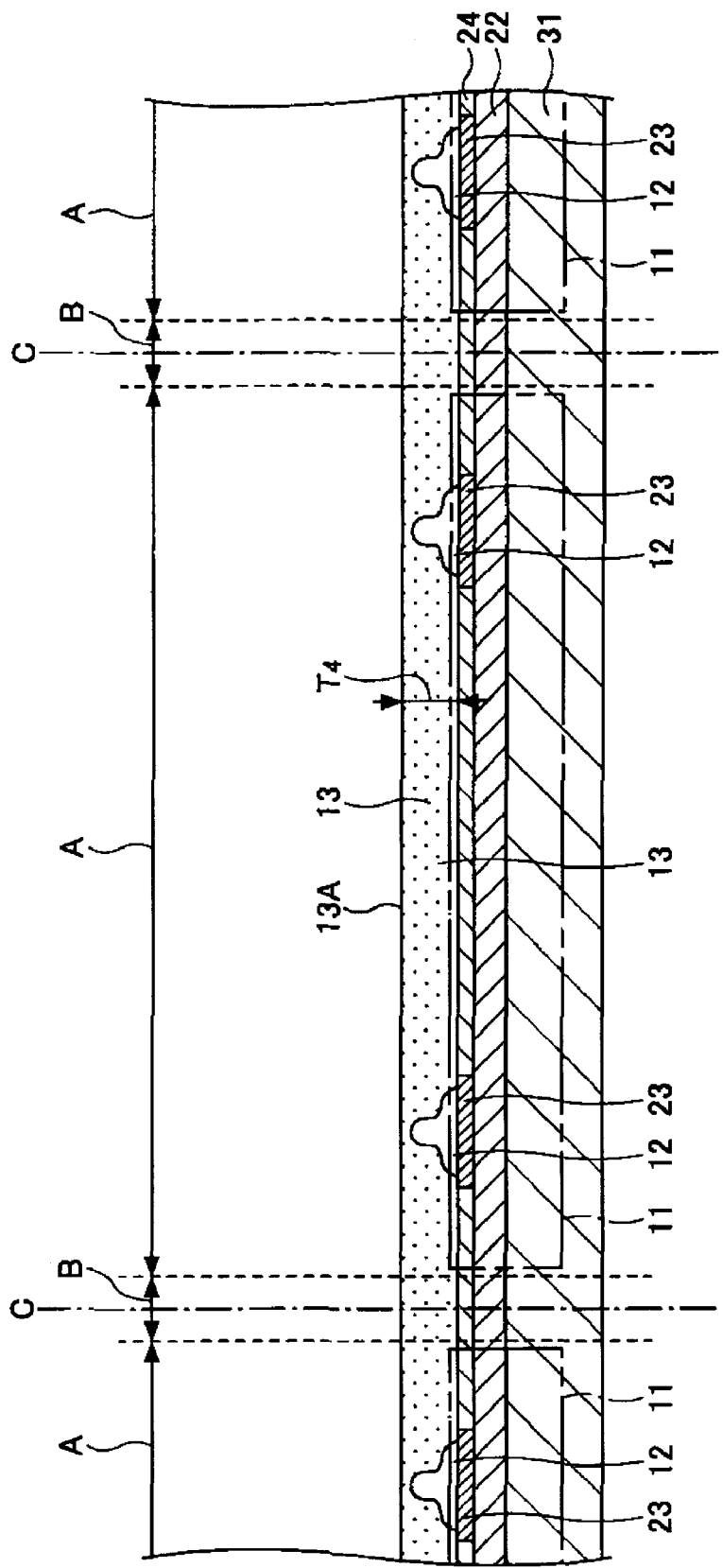
FIG. 8 is a view (the fourth) showing a manufacturing step of the semiconductor device of the first embodiment of the invention.

Then, in the step shown in FIG. 8, the insulation layer 13 (first insulation layer) is formed so as to cover a plurality of the semiconductor chips 11 on the side thereof on which the internal connection terminals 12 are provided (on the front surface side of a plurality of the semiconductor chips 11) and the internal connection terminals 12 (first insulation layer formation step). Here, the insulation layer 13 covers the whole surface of the semiconductor substrate including the semiconductor device formation regions A, the scribe region B and the substrate cutting position C. As the insulation layer 13, there can be used, for example, a sheet-like insulation resin having adherence property (e.g., NCF (Non Conductive Film)), or a paste-like insulation resin (e.g., NCP (Non Conductive Paste)).

When the sheet-like insulation resin having adherence property is used, the sheet-like insulation resin is bonded on the top surface side of the structure shown in FIG. 7 to form the insulation layer 13. Alternatively, when the paste-like insulation resin is used as the insulation layer 13, the paste-like insulation resin is formed on the top surface side of the structure shown in FIG. 7 by a printing process, and then, the insulation resin is pre-baked and semi-hardened. The semi-hardened insulation resin has adherence property. The thickness $T_4$ of the insulation layer 13 can be set at, for example, 20 μm to 100 μm.

Figure 9:
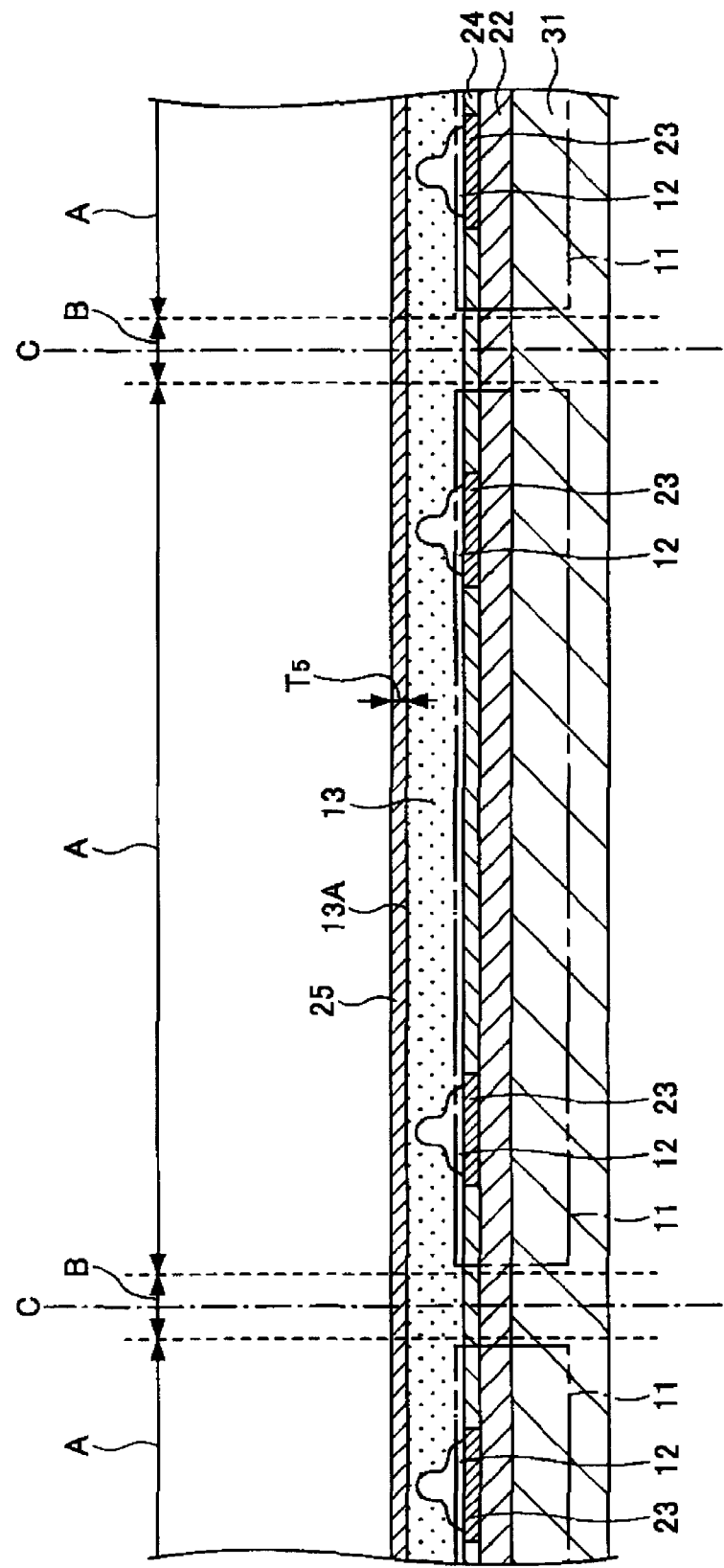
FIG. 9 is a view (the fifth) showing a manufacturing step of the semiconductor device of the first embodiment of the invention.

Then, in the step shown in FIG. 9, a metal foil 25 is formed on the top surface 13A of the insulation layer 13. Specifically, as the metal foil 25, Cu foil is prepared and the Cu foil is bonded on the top surface 13A of the insulation layer 13. The thickness $T_5$ of the metal foil 25 can be set at, for example, 10 μm.

Figure 10:
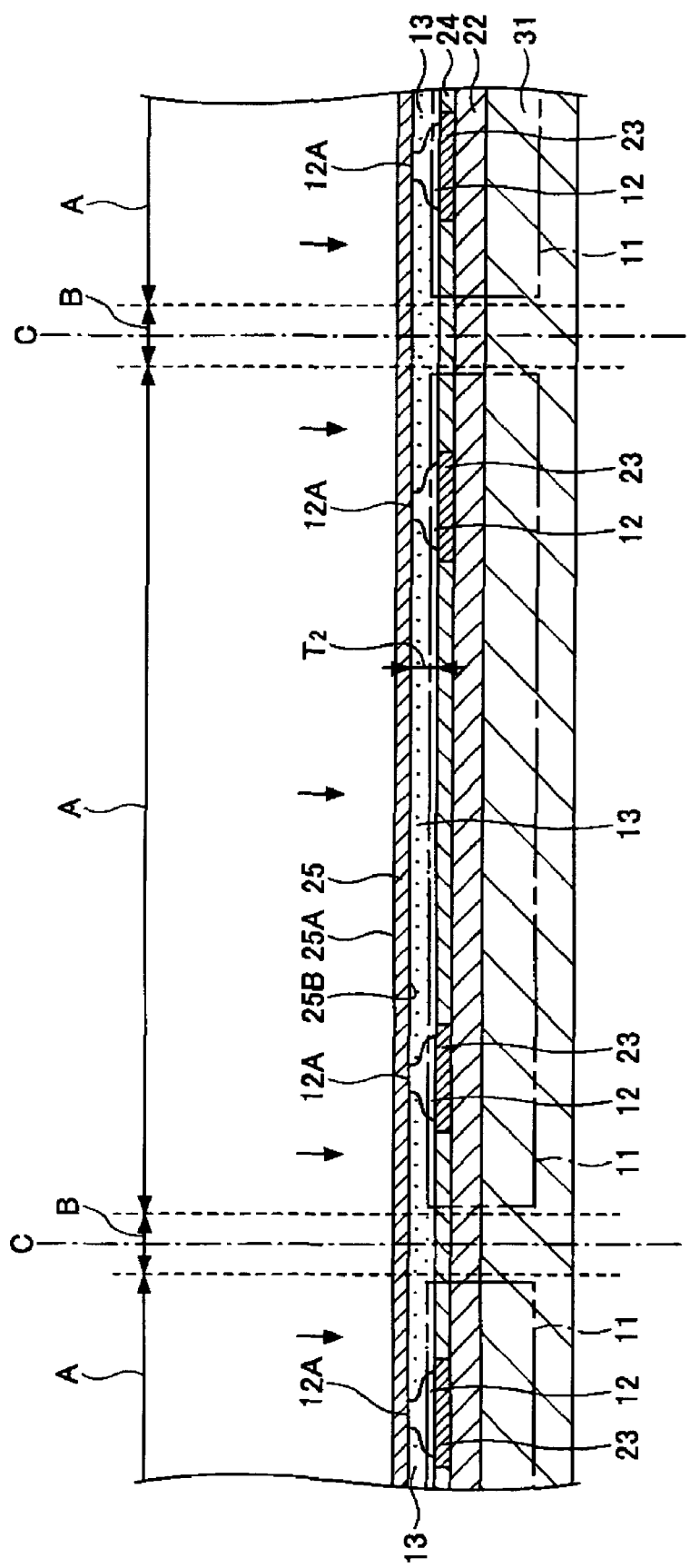
FIG. 10 is a view (the sixth) showing a manufacturing step of the semiconductor device of the first embodiment of the invention.

Then, in the step shown in FIG. 10, with the structure shown in FIG. 9 being heated, the metal foil 25 is pressed from the top surface 25A side of the metal foil 25. As a result, the bottom surface 25B of the metal foil 25 and the top surfaces 12A of a plurality of the internal connection terminals 12 are brought in contact with each other, thereby to press bond the metal foil 25 and the internal connection terminals 12 (press bonding step). Further, by heating the structure shown in FIG. 9, the insulation layer 13 is hardened. The thickness $T_2$ of the insulation layer 13 after press bonding can be set at, for example, 10 μm to 60 μm. Then, in the step shown in FIG. 11, the metal foil 25 is entirely removed by etching. By the steps shown in FIGS. 9 to 11, the adhesion between the metal layer 26 and the internal connection terminals 12 can be enhanced in the step of FIG. 12 described later.

Figure 11:
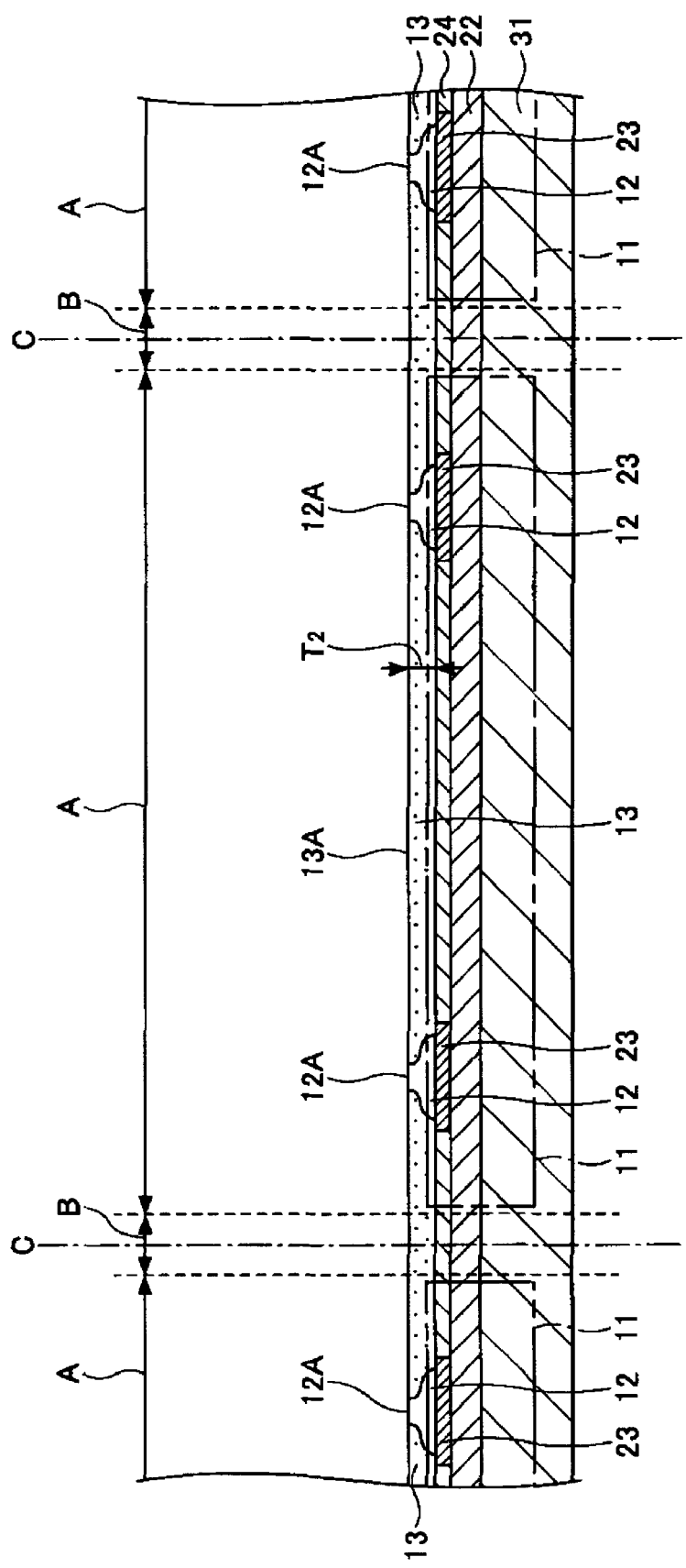
FIG. 11 is a view (the seventh) showing a manufacturing step of the semiconductor device of the first embodiment of the invention.
Figure 12:
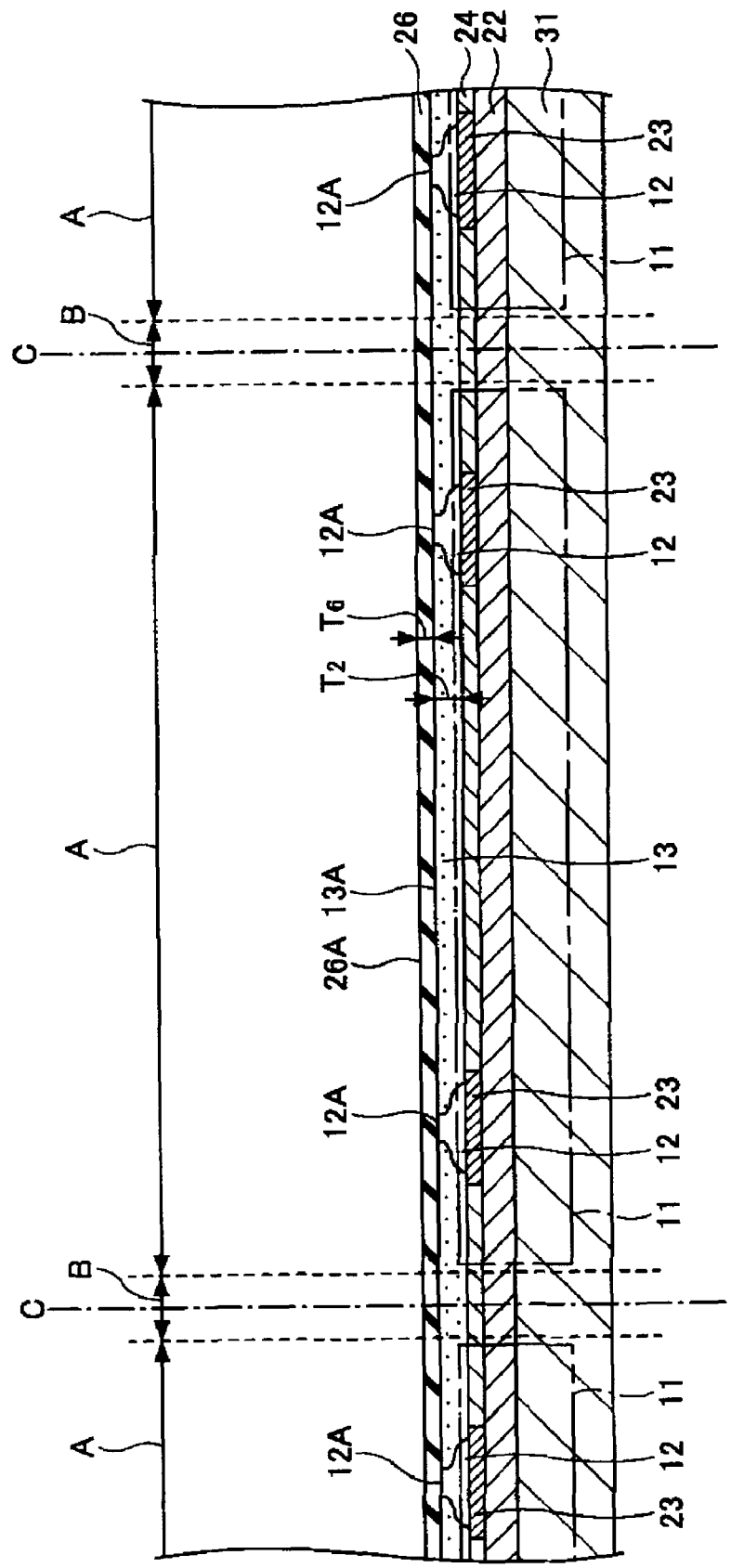
FIG. 12 is a view (the eighth) showing a manufacturing step of the semiconductor device of the first embodiment of the invention.

Then, in the step shown in FIG. 12, the metal layer 26 is formed so as to cover the top surface of the structure shown in FIG. 11 (the top surface 13A of the insulation layer 13) by, for example, a sputtering process (metal layer formation step). The metal layer 26 and the internal connection terminals 12 are electrically connected. As the metal layer 26, there can be used, for example, a Cu layer, a laminate including a Cu layer and a Cr layer, or a laminate including a Cu layer and a Ti layer. Alternatively, the metal layer 26 may be an electroless Cu-plated layer, a metal thin film layer formed by a vapor deposition process, a coating process, a chemical vapor deposition (CVD) process, or the like. Still alternatively, the foregoing metal layer formation processes may be combined. The thickness $T_6$ of the metal layer 26 can be set at, for example, 10 µm.

Figure 13:
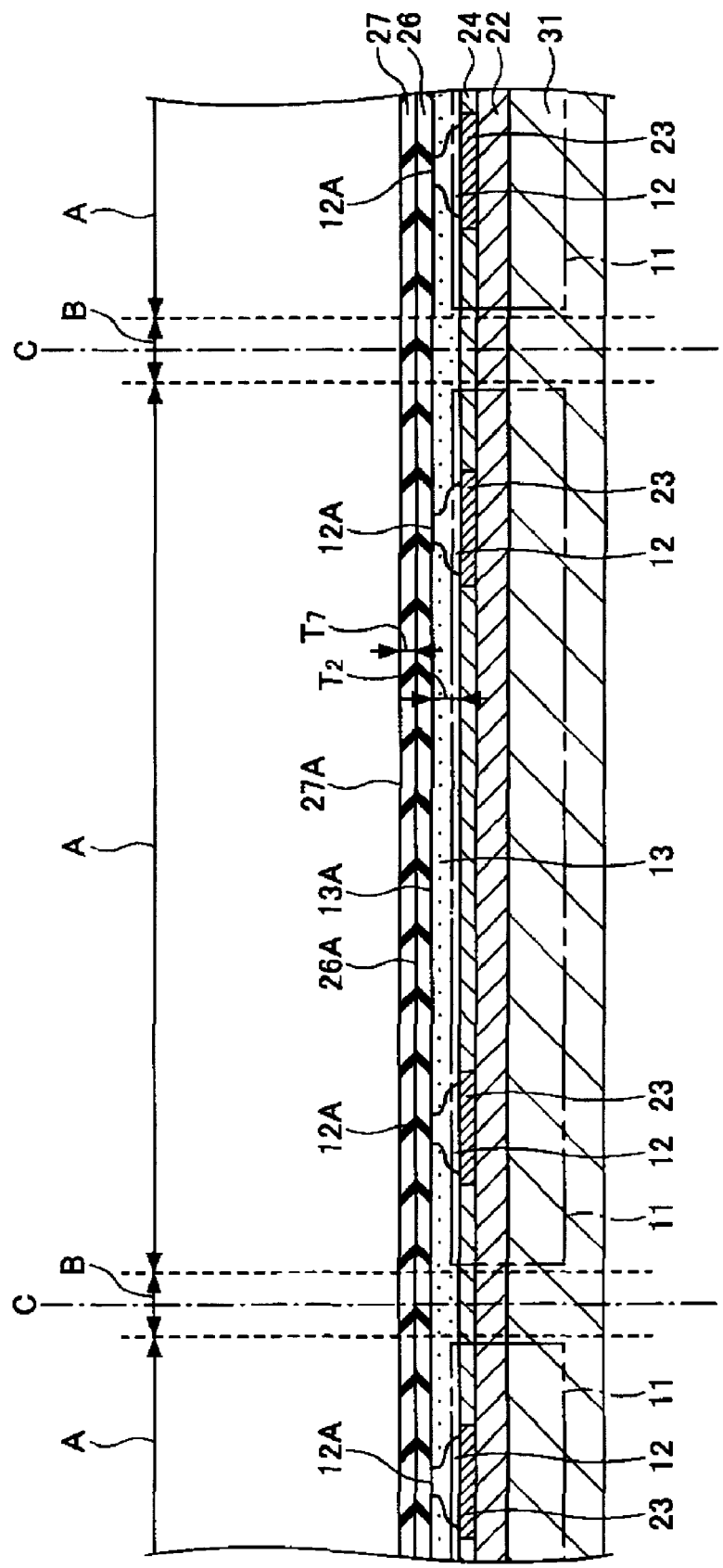
FIG. 13 is a view (the ninth) showing a manufacturing step of the semiconductor device of the first embodiment of the invention.
Figure 14:
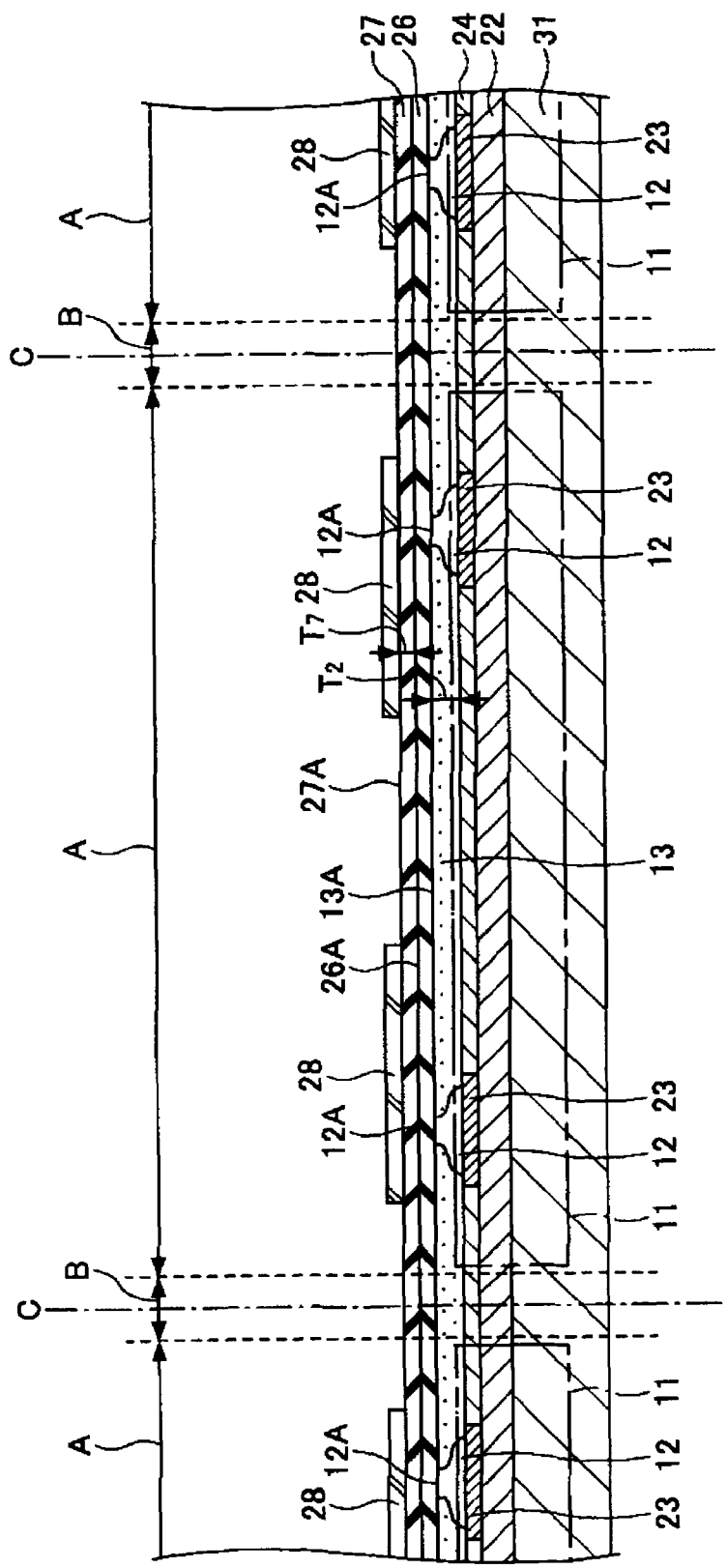
FIG. 14 is a view (the tenth) showing a manufacturing step of the semiconductor device of the first embodiment of the invention.

Then, in the step shown in FIG. 13, the second metal layer 27 is formed so as to cover the top surface of the structure shown in FIG. 12 (the top surface 26A of the metal layer 26), for example, with the metal layer 26 as a power feed layer, by an electroplating process, or the like (metal layer formation step). Specifically, as the second metal layer 27, Cu or the like can be used. The thickness $T_7$ of the second metal layer 27 can be set at, for example, 10 µm. Then, in the step shown in FIG. 14, a resist is coated on the top surface 27A of the second metal layer 27 and the resist is exposed to light, and developed, thereby to form a resist film 28 on the top surface 27A of the second metal layer 27 at the portion corresponding to the formation region of the wiring pattern 14.

Figure 15:
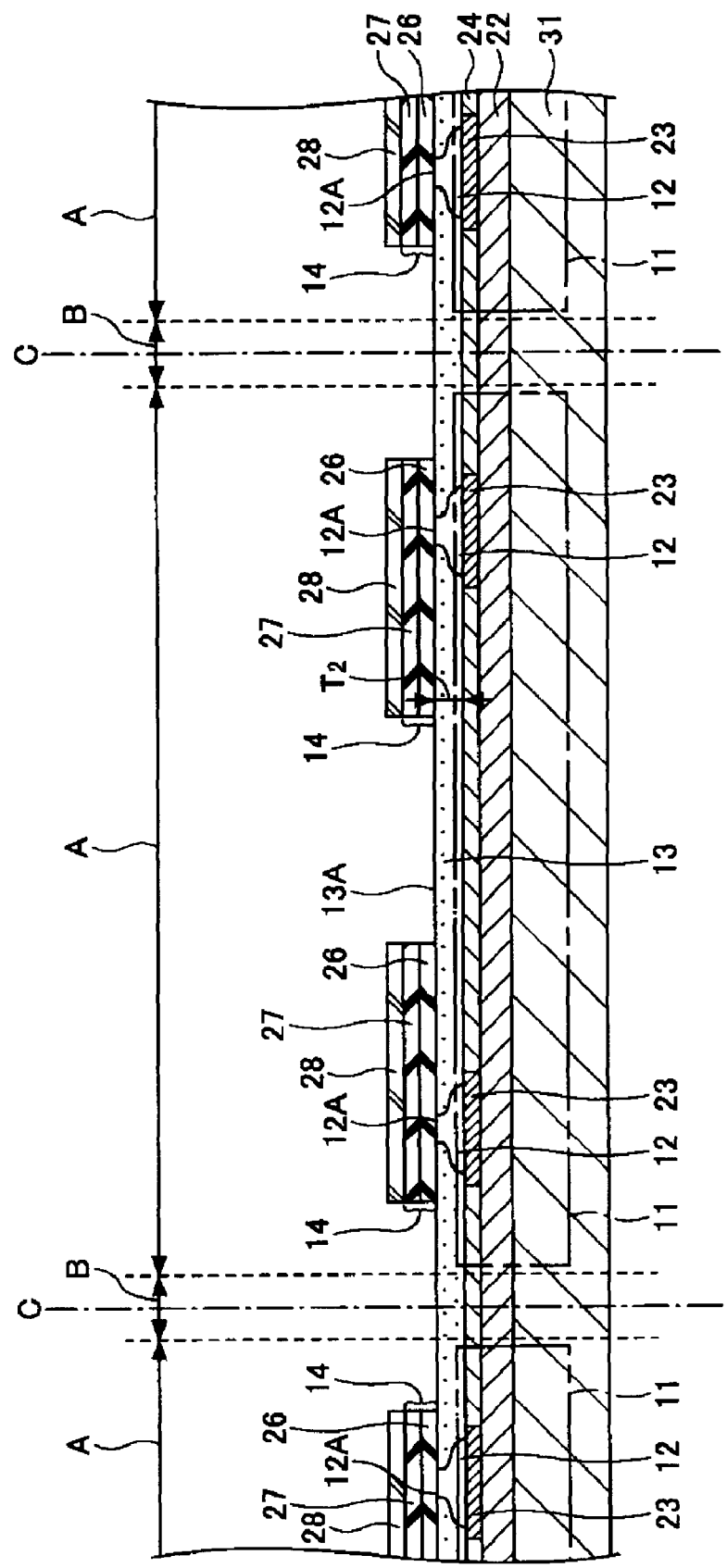
FIG. 15 is a view (the eleventh) showing a manufacturing step of the semiconductor device of the first embodiment of the invention.

Then, in the step shown in FIG. 15, the metal layer 26 and the second metal layer 27 are etched by using the resist film 28 as a mask, thereby to remove the metal layer 26 and the second metal layer 27 at the portion on which the resist film 28 is not formed. As a result, the wiring pattern 14 is formed (wiring pattern formation step).

Figure 16:
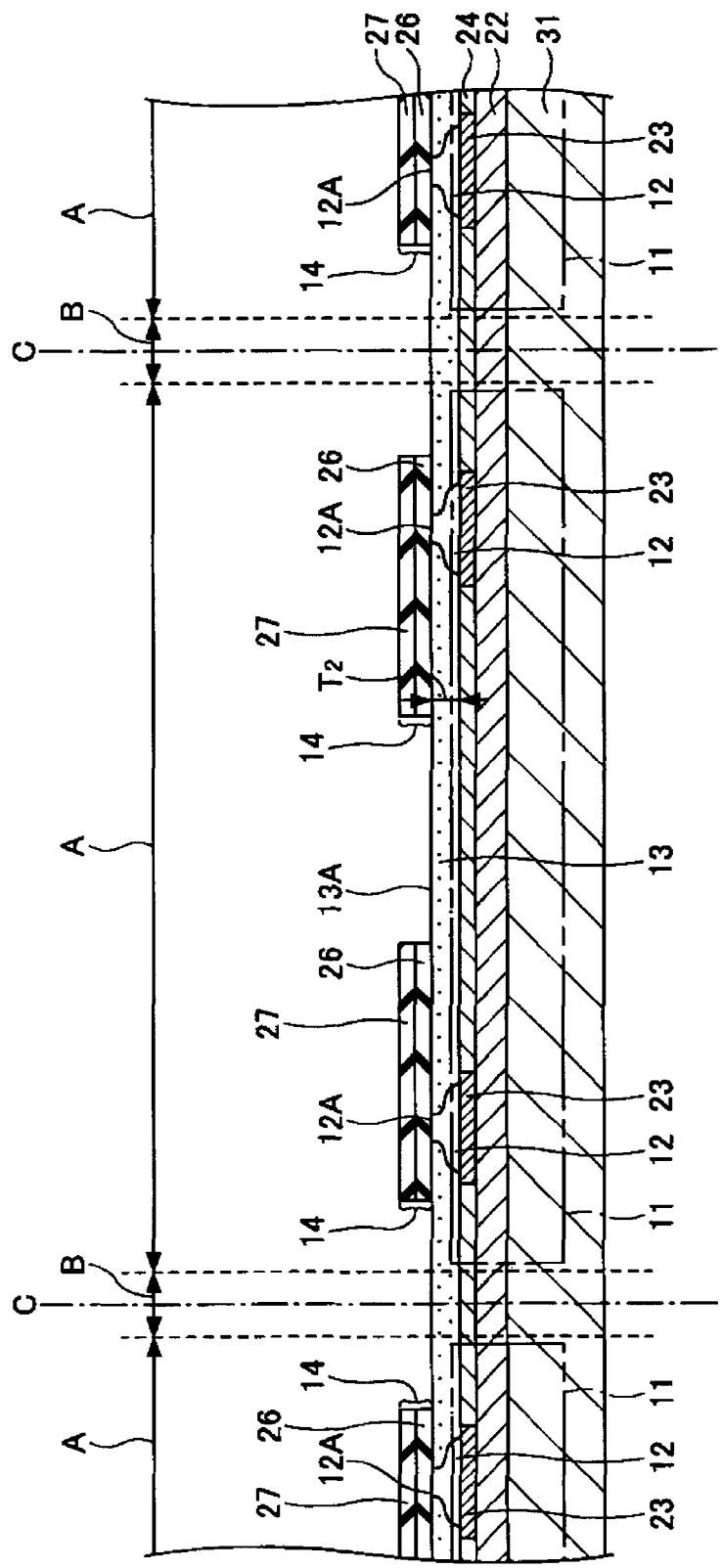
FIG. 16 is a view (the twelfth) showing a manufacturing step of the semiconductor device of the first embodiment of the invention.

Then, in the step shown in FIG. 16, the resist film 28 shown in FIG. 15 is removed. Thereafter, the roughening processing of the wiring pattern 14 is carried out. The roughening processing of the wiring pattern 14 can be carried out by either process of a blackening processing or a roughening etching processing. The roughening processing is for improving the adhesion between the wiring pattern 14 and the solder resist 16 formed on the top surface and the side surface of the wiring pattern 14.

Figure 17:
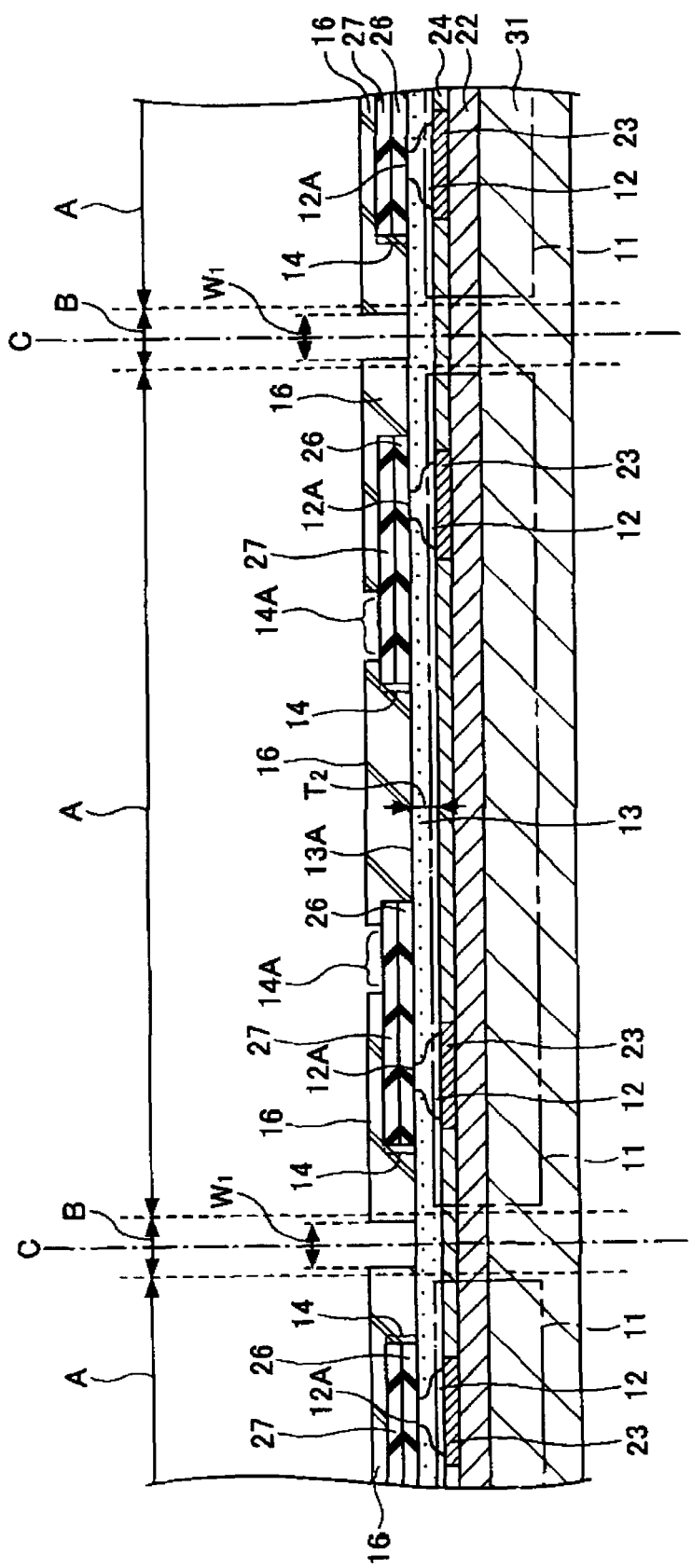
FIG. 17 is a view (the thirteenth) showing a manufacturing step of the semiconductor device of the first embodiment of the invention.

Then, in the step shown in FIG. 17, a resist is coated so as to cover the tops of the wiring pattern 14 and the insulation layer 13. Then, by a photolithography process, the resist is exposed to light, and developed. The resist at the portions corresponding to the external connection terminal provision region 14A and the whole of, or a part of the scribe region B is removed by etching. As a result, the solder resist 16 (second insulation layer) having openings for exposing the external connection terminal provision region 14A and the whole of, or a part of the scribe region B is formed (second insulation layer formation step).

That is, the solder resist 16 (second insulation layer) is formed on the insulation layer 13 (the first insulation layer) except for a region corresponding to the substrate cutting position C. In other words, a part of the insulation layer 13 (first insulation layer) corresponding to the substrate cutting position C of the semiconductor substrate 31 is exposed through the opening of solder resist 16 (the second insulation layer).

Note that the opening for exposing the whole of, or a part of the scribe region B is necessarily formed so as to expose the substrate cutting position C. The thickness of the solder resist 16 can be set at, for example, 25 µm. The width of the scribe region B can be set at, for example, 200 µm. Further, the width $W_1$ of the opening of the solder resist 16 corresponding to the scribe region B can be set at, for example, 150 µm in view of the alignment deviation between the solder resist 16 and the structure shown in FIG. 16, and the like.

Figure 18:
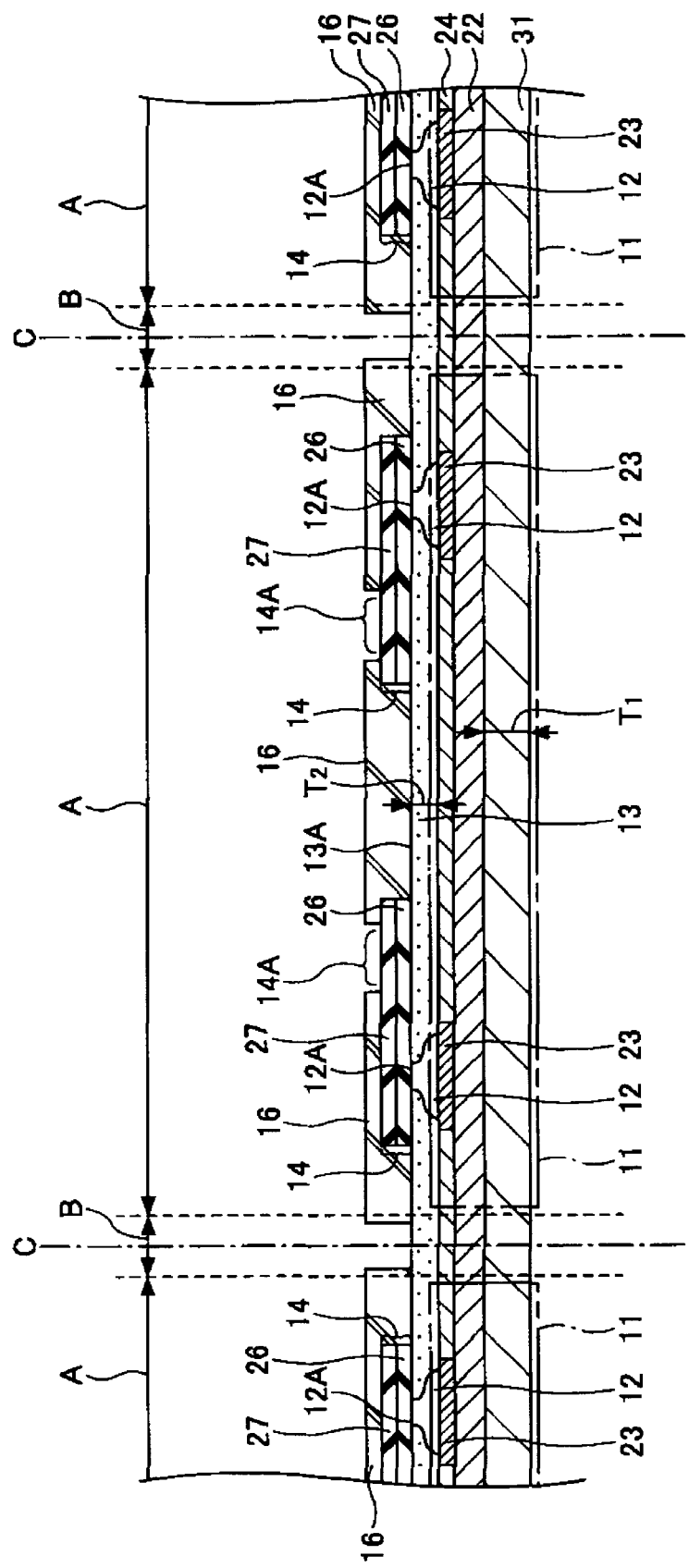
FIG. 18 is a view (the fourteenth) showing a manufacturing step of the semiconductor device of the first embodiment of the invention.

Then, in the step shown in FIG. 18, the semiconductor substrate 31 is polished or ground from the rear surface side of the semiconductor substrate 31, thereby to laminate the semiconductor substrate 31. For lamination of the semiconductor substrate 31, for example, a backside grinder can be used. The thickness $T_1$ of the semiconductor substrate 31 after lamination can be set at, for example, 100 µm to 300 µm.

Figure 19:
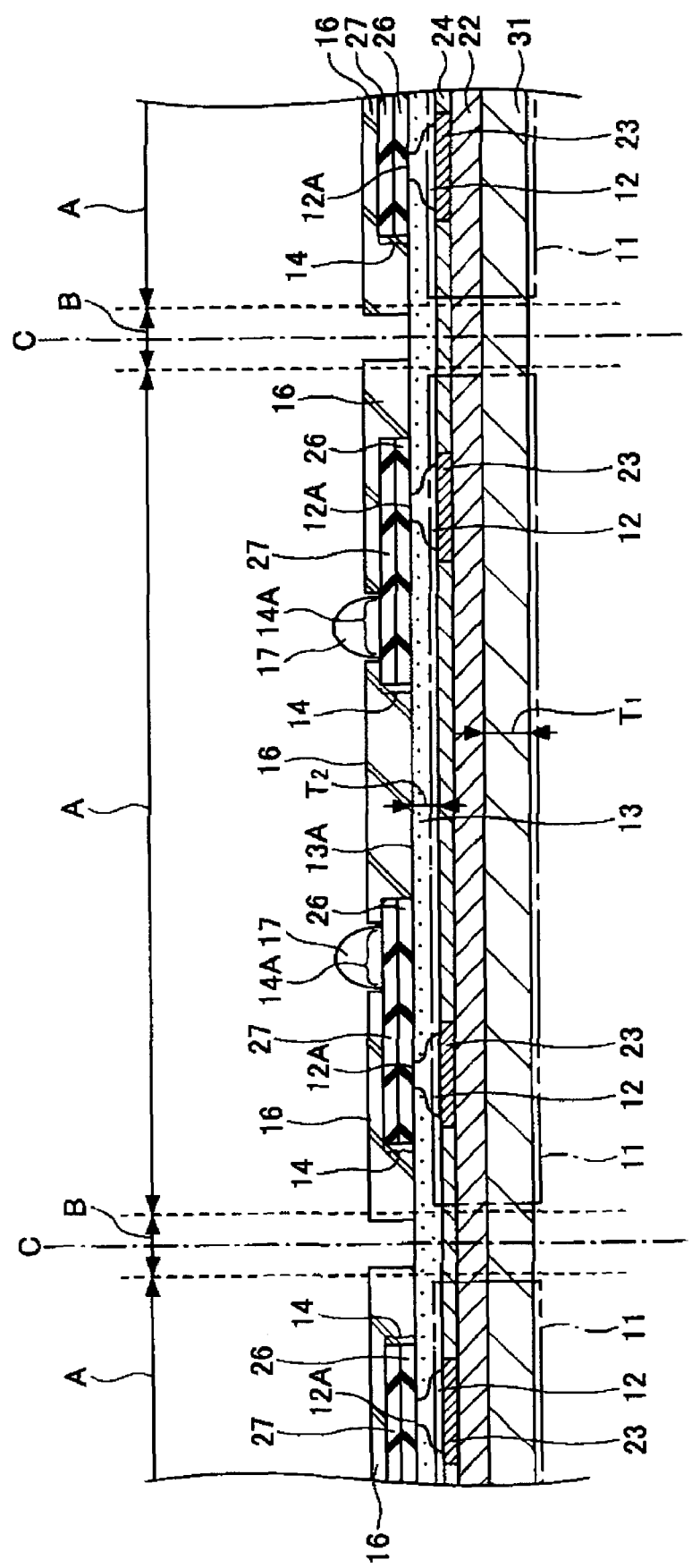
FIG. 19 is a view (the fifteenth) showing a manufacturing step of the semiconductor device of the first embodiment of the invention.
Figure 20:
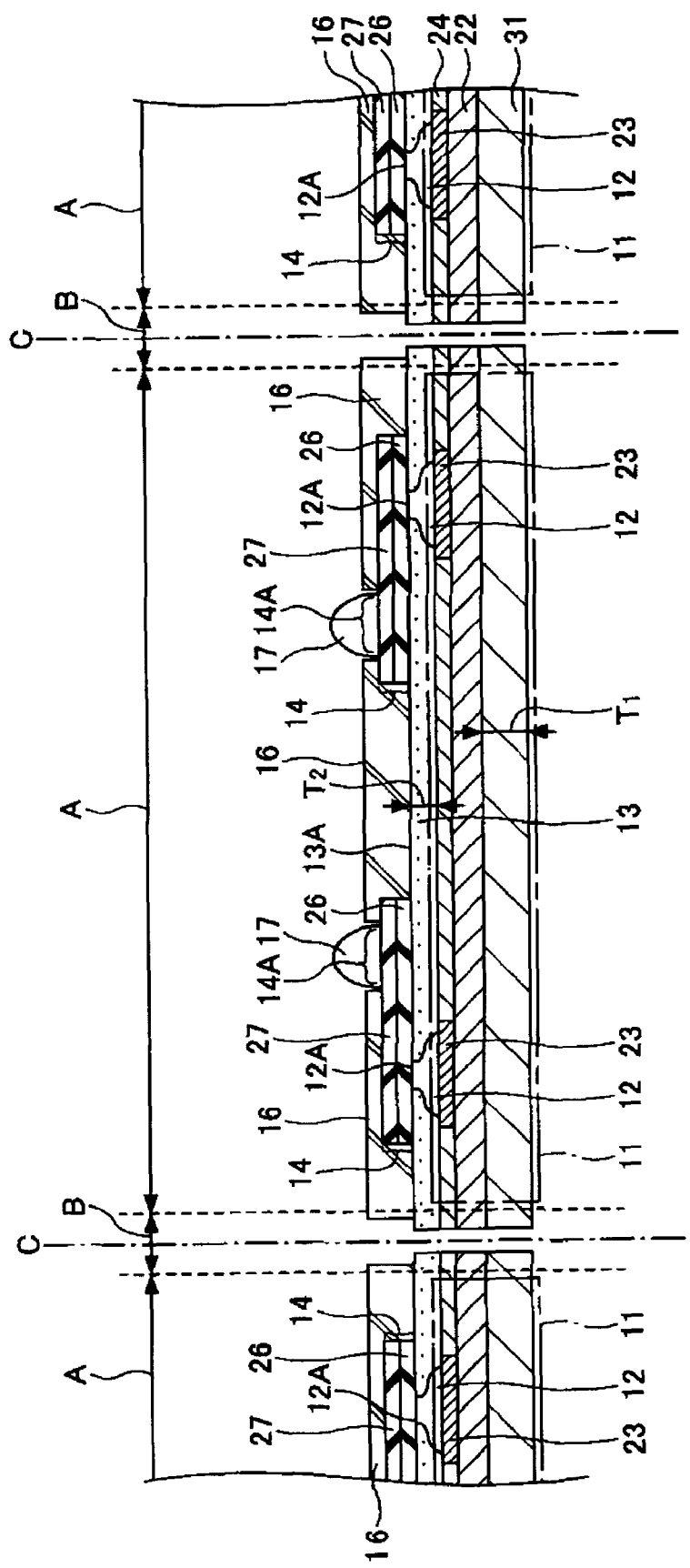
FIG. 20 is a view (the sixteenth) showing a manufacturing step of the semiconductor device of the first embodiment of the invention.

Then, in the step shown in FIG. 19, the external connection terminals 17 are formed in the external connection terminal provision regions 14A of the wiring pattern 14 (external connection terminal formation step). As a result, the structures corresponding to the semiconductor devices 10 are formed in a plurality of the semiconductor device formation regions A. Then, in the step shown in FIG. 20, the semiconductor substrate 31 corresponding to the scribe region B is cut along the substrate cutting position C (cutting step). As a result, a plurality of the semiconductor devices 10 are manufactured. Cutting of the semiconductor substrate 31 is carried out by, for example, dicing.

Incidentally, on the whole of, or a part of the scribe region B of the semiconductor device 10, the solder resist 16 is not formed. The solder resist 16 at the portion corresponding to the substrate cutting position C is necessarily opened. Therefore, when the semiconductor substrate 31 is cut at the substrate cutting position C, the semiconductor chips 11 and the insulation layer 13 are cut, but the solder resist 16 is not cut. Therefore, the insulation layer 13 is exposed at the outer periphery of the semiconductor device 10 (the main surface of the semiconductor chip 11 is not exposed). A difference in level is caused at the boundary portion between the insulation film 13 and the solder resist 16.

In accordance with the semiconductor device and the manufacturing method thereof of the first embodiment of the invention, the solder resist 16 (second insulation layer) is not formed on the whole of, or a part of the scribe region B of the semiconductor device 10, and the solder resist 16 (second insulation layer) at the portion corresponding to the substrate cutting position C is necessarily opened. For this reason, the cut surface of the insulation layer 13 (first insulation layer) and the end face of the solder resist 16 (second insulation layer) have a certain distance $L_1$ therebetween, which enables the reduction of the effects of the tensile stress and the hardening shrinkage force exerted on the D part (releasing of the stress applied on the D part) by the solder resist 16 (second insulation layer). This can prevent the peeling of the insulation layer 13 (first insulation layer) from the semiconductor chips 11, which can improve the yield of the semiconductor device 10.

Further, the whole semiconductor chip 11 is covered with the insulation layer 13 (first insulation layer), and the main surface of the semiconductor chip 11 is not exposed. Thus, it is possible to enhance the reliability of the semiconductor device 10.

Second Embodiment

Figure 21:
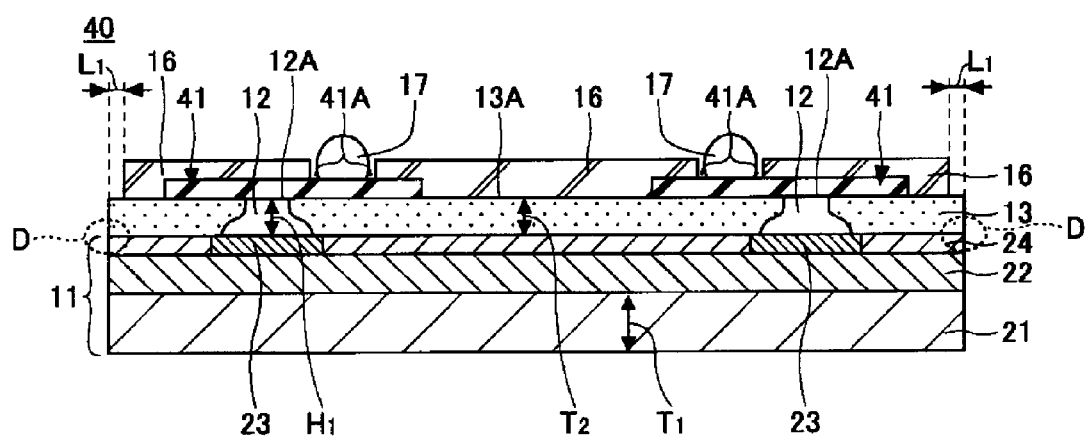
FIG. 21 is a cross sectional view of a semiconductor device of a second embodiment of the invention.
Figure 22:
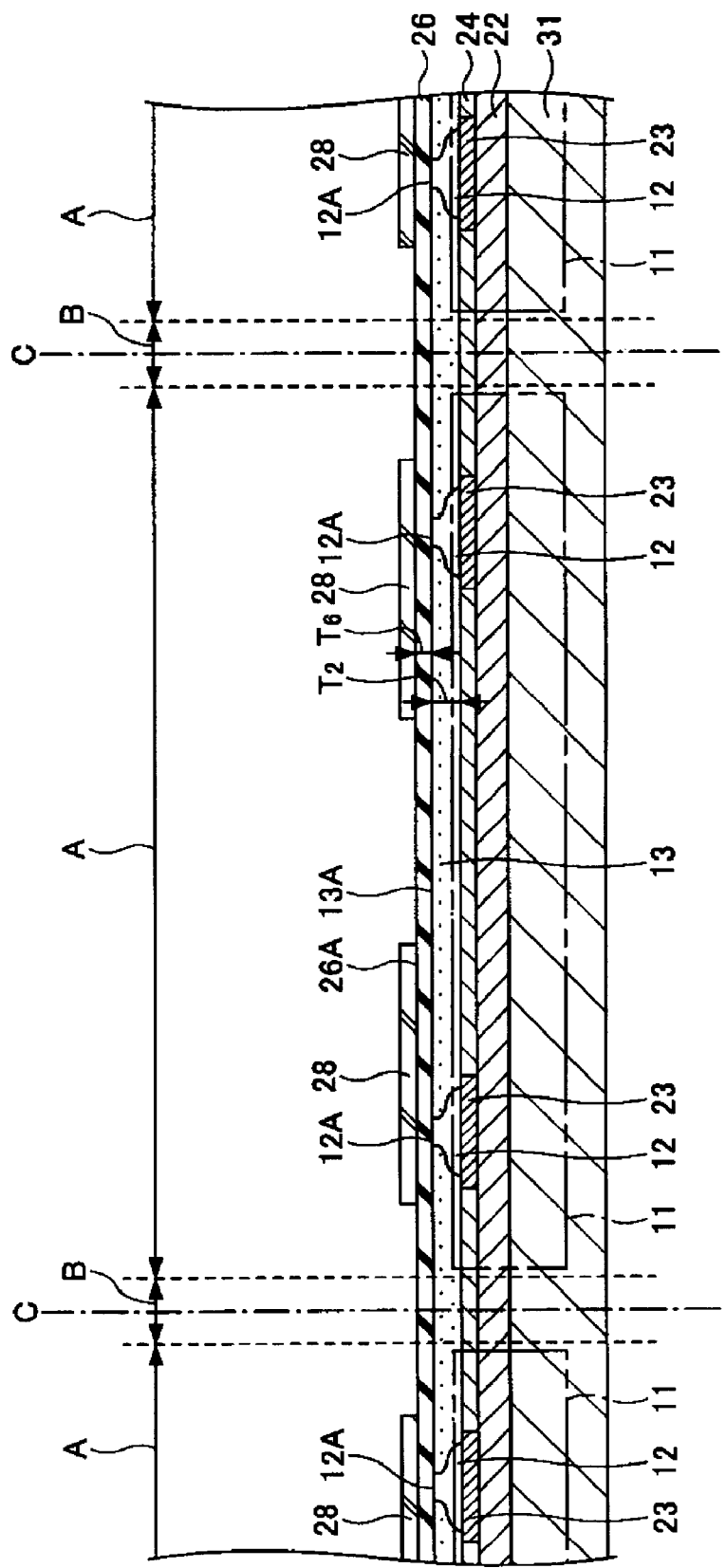
FIG. 22 is a view (the first) showing a manufacturing step of the semiconductor device of the second embodiment of the invention.

FIG. 21 is a cross sectional view of a semiconductor device in accordance with a second embodiment of the invention. In FIG. 21, the same constituent parts as those of the semiconductor device 10 of the first embodiment are given the same reference numerals and signs. By reference to FIG. 21, a semiconductor device 40 of the second embodiment is configured in the same manner as the semiconductor device 10, except that a wiring pattern 41 including a metal layer 26 is provided in place of the wiring pattern 14 including the metal layer 26 and the second metal layer 27 provided in the semiconductor device 10 of the first embodiment.

FIGS. 22 to 28 are views showing the manufacturing steps of the semiconductor device in accordance with the second embodiment of the invention. In FIGS. 22 to 28, the same constituent parts as those of the semiconductor device 40 of the second embodiment are given the same reference numerals and signs. By reference to FIGS. 22 to 28, a description will be given to the manufacturing method of the semiconductor device 40 of the second embodiment. First, by performing the same processings as those in the steps shown in FIGS. 5 to 12 described in the first embodiment of the invention, the structure shown in FIG. 12 is formed. Then, in the step shown in FIG. 22, a resist is coated on the top surface of the structure shown in FIG. 12 (the top surface 26A of the metal layer 26). Then, the resist is exposed to light, and developed, thereby to form a resist film 28 on the metal layer 26 at the portion corresponding to the formation region of the wiring pattern 41.

Figure 23:
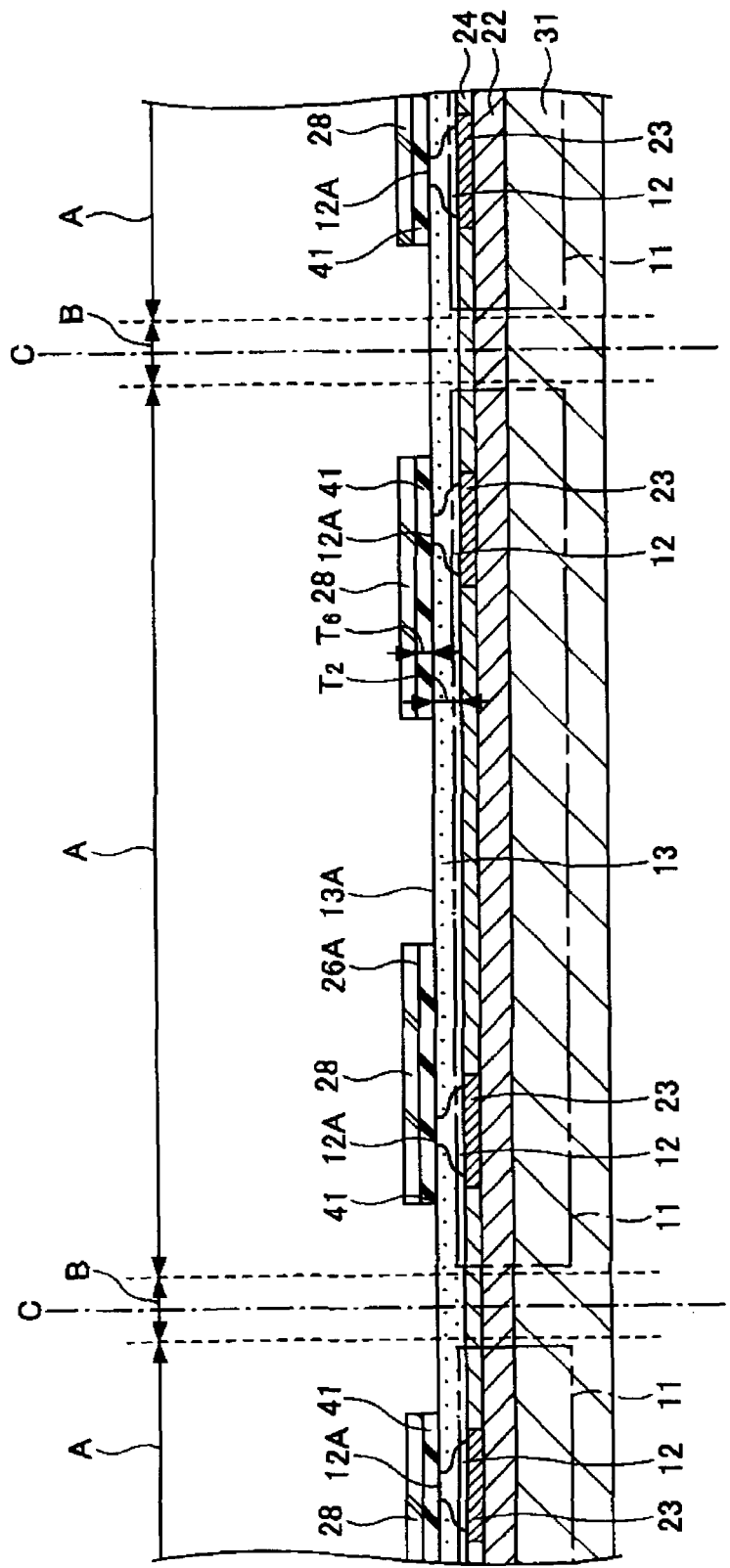
FIG. 23 is a view (the second) showing a manufacturing step of the semiconductor device of the second embodiment of the invention.

Then, in the step shown in FIG. 23, the metal layer 26 is etched by using the resist film 28 as a mask, thereby to remove the metal layer 26 at the portion on which the resist film 28 is not formed. As a result, the wiring pattern 41 is formed (wiring pattern formation step).

Figure 24:
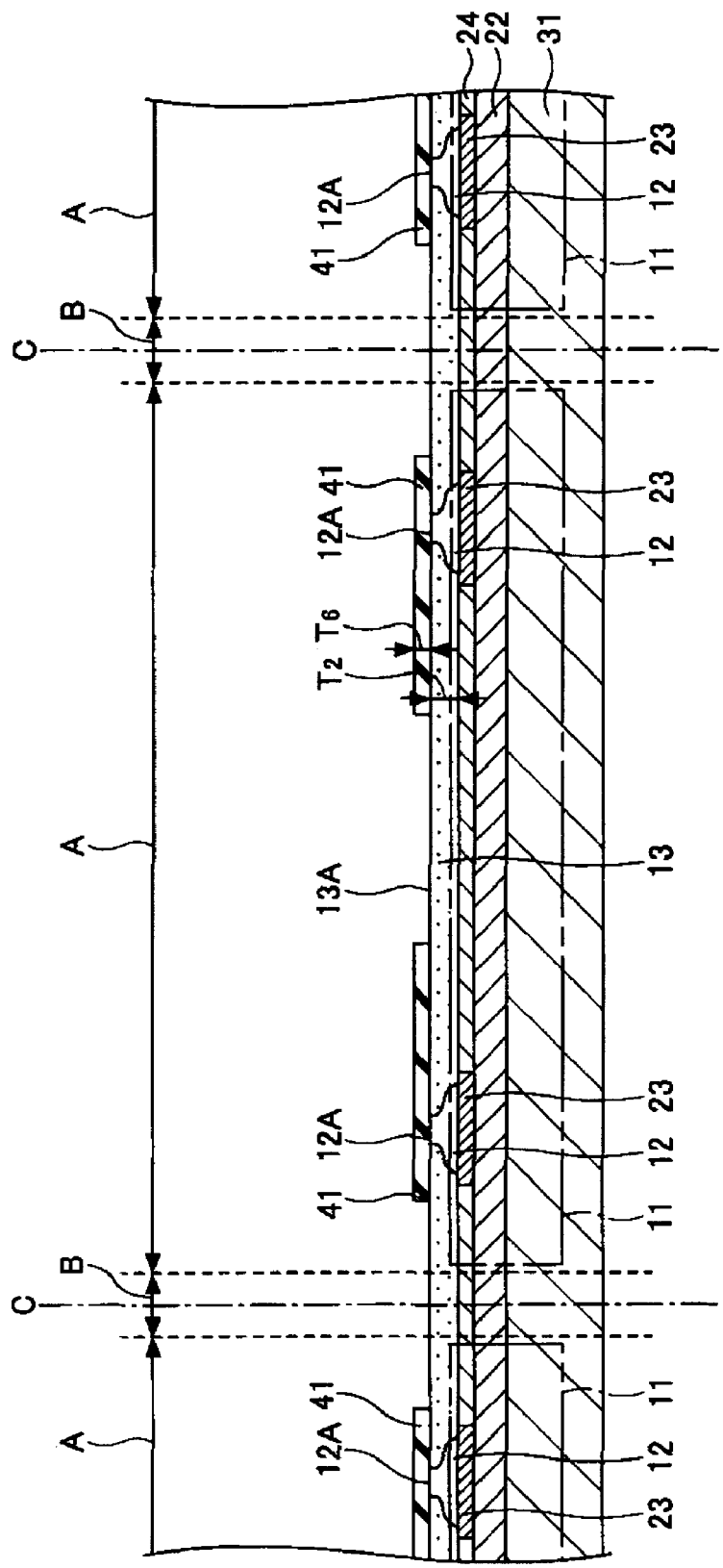
FIG. 24 is a view (the third) showing a manufacturing step of the semiconductor device of the second embodiment of the invention.

Then, in the step shown in FIG. 24, the resist film 28 shown in FIG. 23 is removed. Thereafter, the roughening processing of the wiring pattern 41 is carried out. The roughening processing of the wiring pattern 41 can be carried out by either process of a blackening processing or a roughening etching processing. The roughening processing is for improving the adhesion between the wiring pattern 41 and the solder resist 16 formed on the top surface and the side surface of the wiring pattern 41.

Figure 25:
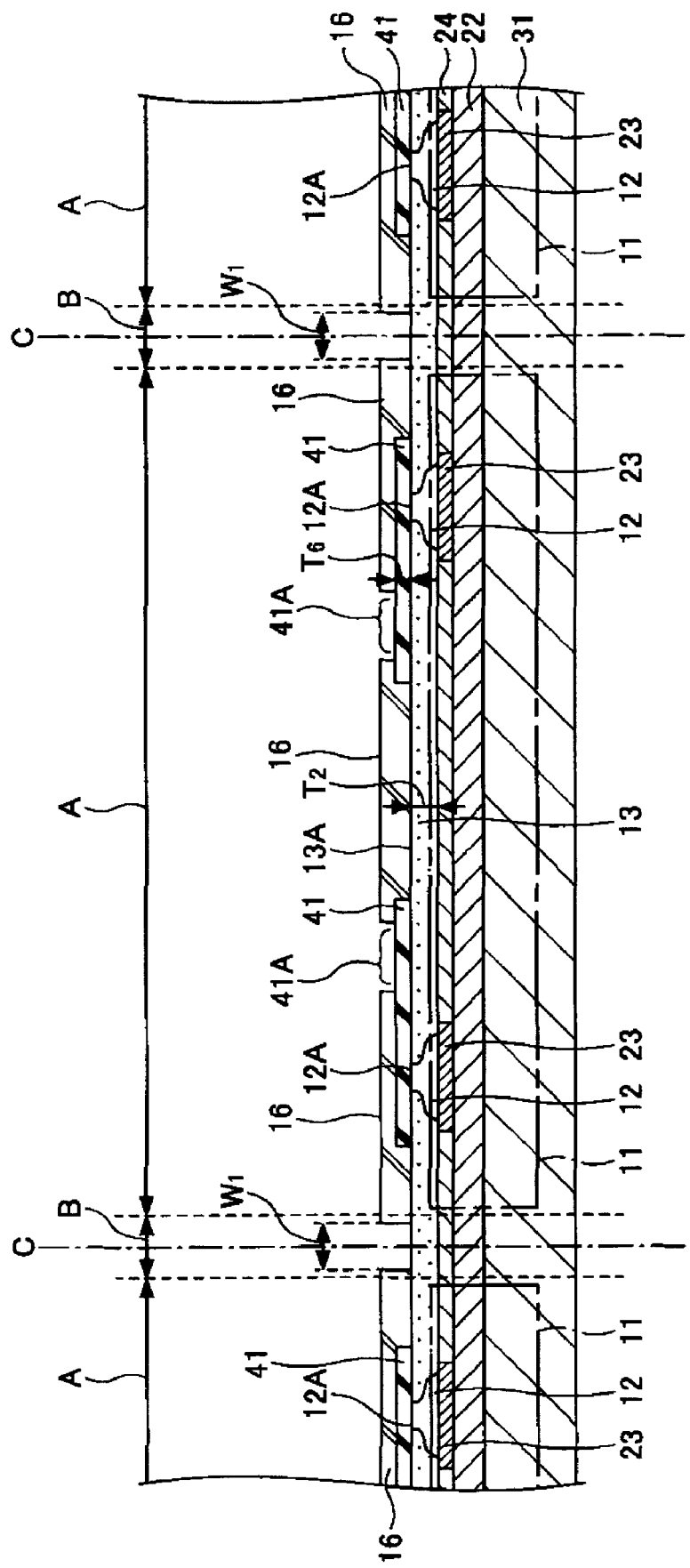
FIG. 25 is a view (the fourth) showing a manufacturing step of the semiconductor device of the second embodiment of the invention.

Then, in the step shown in FIG. 25, a resist is coated so as to cover the tops of the wiring pattern 41 and the insulation layer 13. Then, by a photolithography process, the resist is exposed to light, and developed. The resist at the portions corresponding to the external connection terminal provision regions 41A and the whole of, or a part of the scribe region B is removed by etching. As a result, the solder resist 16 (second insulation layer) having openings for exposing the external connection terminal provision regions 41A and the whole of, or a part of the scribe region B is formed (second insulation layer formation step).

Incidentally, the openings for exposing the whole of, or a part of the scribe region B are necessarily formed so as to expose the substrate cutting position C. The thickness of the solder resist 16 can be set at, for example, 25 μm. The width of the scribe region B can be set at, for example, 200 μm. Further, the width $W_1$ of the opening of the solder resist 16 corresponding to the scribe region B can be set at, for example, 150 μm in view of the alignment deviation between the solder resist 16 and the structure shown in FIG. 24, and the like.

Figure 26:
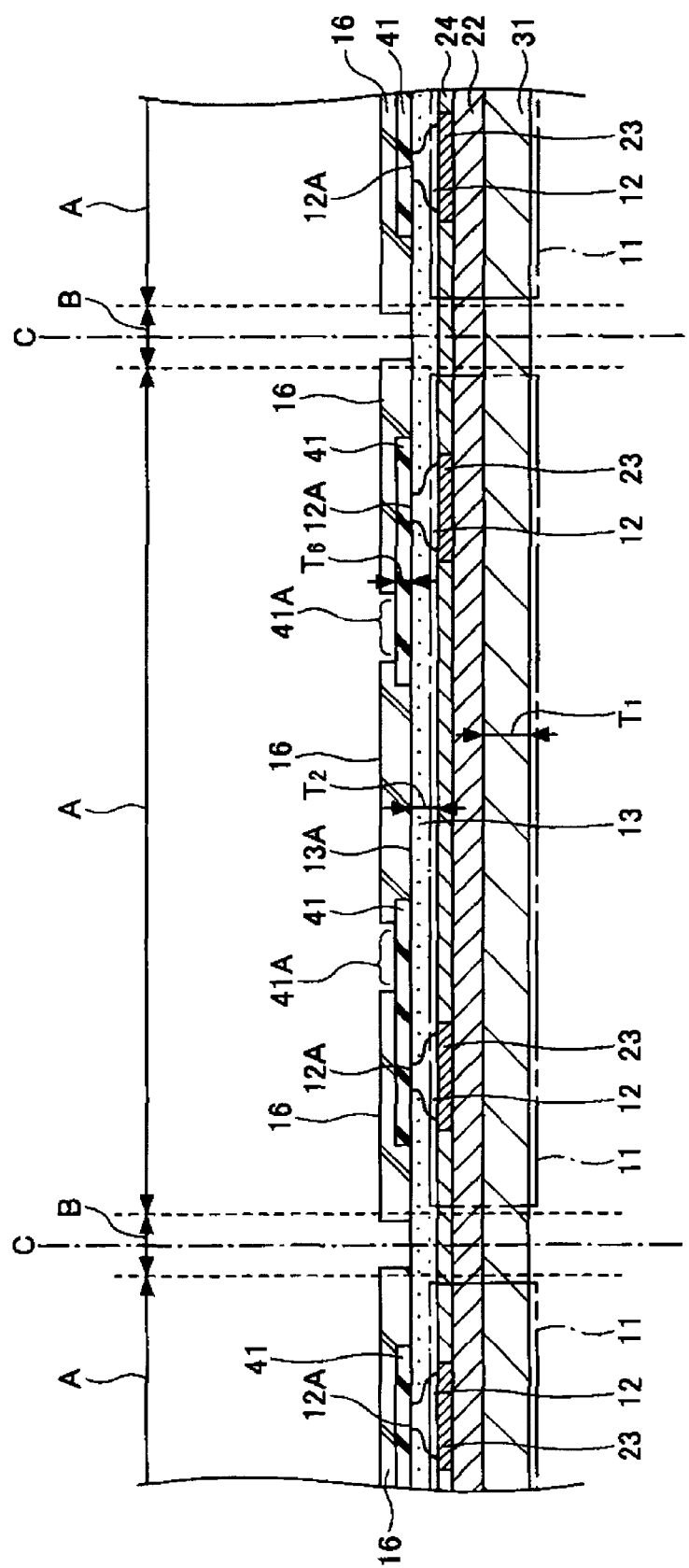
FIG. 26 is a view (the fifth) showing a manufacturing step of the semiconductor device of the second embodiment of the invention.

Then, in the step shown in FIG. 26, the semiconductor substrate 31 is polished or ground from the rear surface side of the semiconductor substrate 31, thereby to laminate the semiconductor substrate 31. For lamination of the semiconductor substrate 31, for example, a backside grinder can be used. The thickness $T_1$ of the semiconductor substrate 31 after lamination can be set at, for example, 100 μm to 300 μm.

Figure 27:
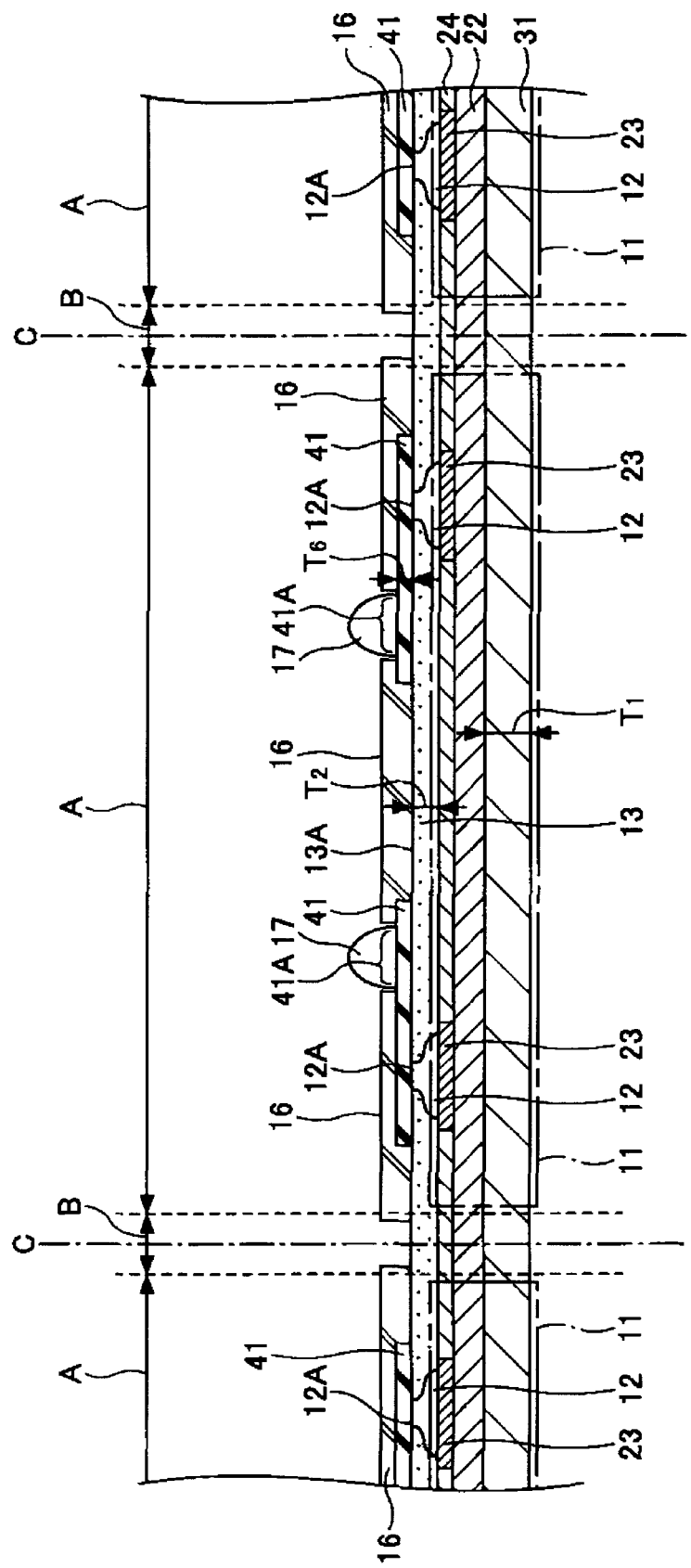
FIG. 27 is a view (the sixth) showing a manufacturing step of the semiconductor device of the second embodiment of the invention.
Figure 28:
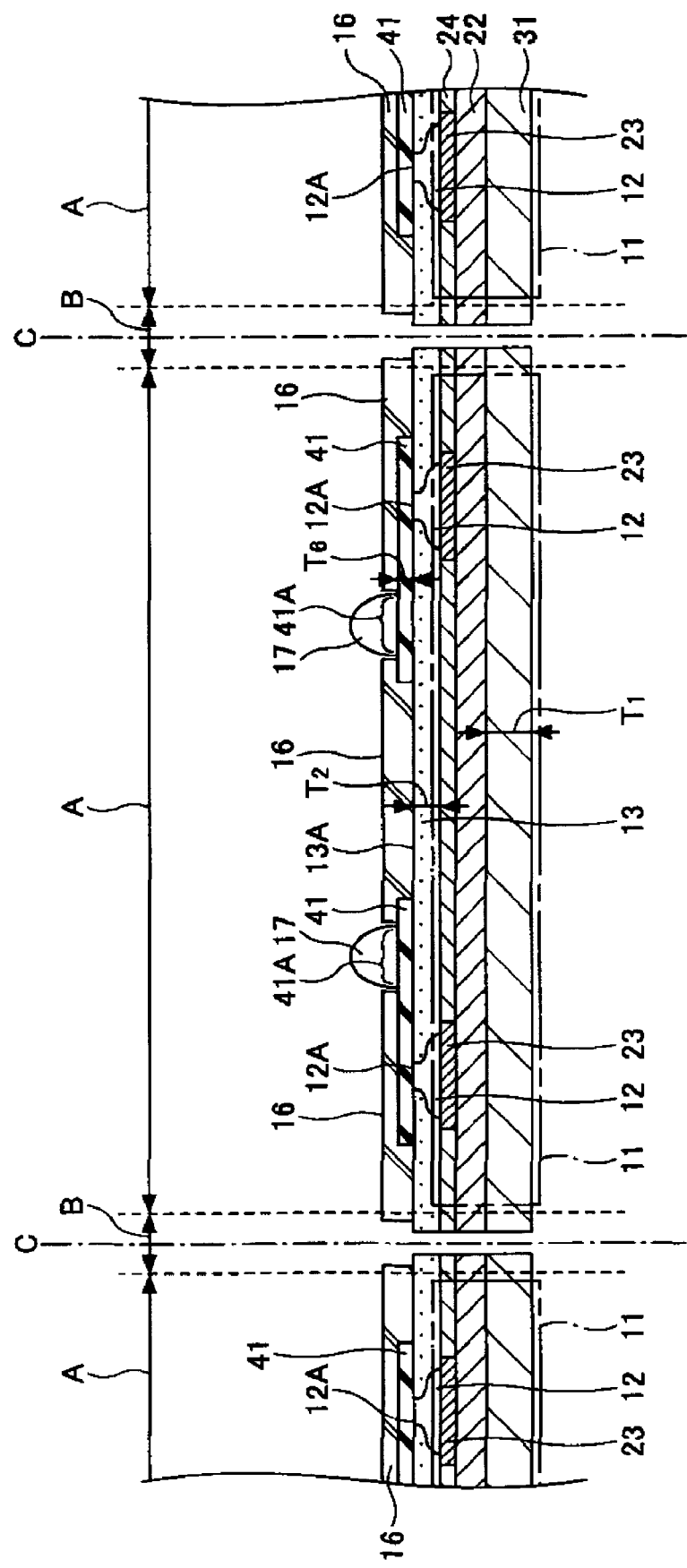
FIG. 28 is a view (the seventh) showing a manufacturing step of the semiconductor device of the second embodiment of the invention.

Then, in the step shown in FIG. 27, the external connection terminals 17 are formed in the external connection terminal provision regions 41A of the wiring pattern 41 (external connection terminal formation step). As a result, the structures corresponding to the semiconductor devices 40 are formed in a plurality of the semiconductor device formation regions A. Then, in the step shown in FIG. 28, the semiconductor substrate 31 corresponding to the scribe region B is cut along the substrate cutting position C (cutting step). As a result, a plurality of the semiconductor devices 40 are manufactured. Cutting of the semiconductor substrate 31 is carried out by, for example, dicing.

Here, on the whole of, or a part of the scribe region B of the semiconductor device 40, the solder resist 16 is not formed. The solder resist 16 at the portion corresponding to the substrate cutting position C is necessarily opened. Therefore, when the semiconductor substrate 31 is cut at the substrate cutting position C, the semiconductor chips 11 and the insulation layer 13 are cut, but the solder resist 16 is not cut. Therefore, the insulation layer 13 is exposed at the outer periphery of the semiconductor device 40 (the main surface of the semiconductor chip 11 is not exposed). Thus, the cut surface of the insulation layer 13 and the end face of the solder resist 16 have a certain distance $L_1$ therebetween.

In accordance with the semiconductor device and the manufacturing method thereof of the second embodiment of the invention, as with the semiconductor device and the manufacturing method thereof of the first embodiment of the invention, the solder resist 16 (second insulation layer) is not formed on the whole of, or a part of the scribe region B of the semiconductor device 40, and the solder resist 16 (second insulation layer) at the portion corresponding to the substrate cutting position C is necessarily opened. For this reason, the cut surface of the insulation layer 13 (first insulation layer) and the end face of the solder resist 16 (second insulation layer) have a certain distance $L_1$ therebetween, which enables the reduction of the effects of the tensile stress and the hardening shrinkage force exerted on the D part (releasing of the stress applied on the D part) by the solder resist 16 (second insulation layer). This can prevent the peeling of the insulation layer 13 (the first insulation layer) from the semiconductor chips 11, which can improve the yield of the semiconductor device 40.

Further, since the whole semiconductor chip 11 is covered with the insulation layer 13 (first insulation layer), and the main surface of the semiconductor chip 11 is not exposed, it is possible to enhance the reliability of the semiconductor device 40.

Heretofore, the preferred embodiments of the invention were described in details. However, the invention is not limited to the foregoing embodiments. Various modifications and replacements can be made in the foregoing embodiments without departing from the scope of the invention.

For example, in the first embodiment and the second embodiment of the invention, the example in which the wiring pattern (rewiring) is formed on the first insulation layer was described. However, this invention is effective in a case where on the semiconductor chips, the first insulation layer and the second insulation layer are stacked in this order, and the second insulation layer exerts a stress on the first insulation layer, so that the semiconductor chips and the first insulation layer are peeled off from each other. For this reason, this invention is also applicable to any semiconductor device in which rewiring is not formed so long as the semiconductor device is a semiconductor device having such a structure that the first insulation layer and the second insulation layer are stacked in this order on the semiconductor chips.

Further, the method for forming the wiring pattern (rewiring) is not limited to the methods described in the first embodiment and the second embodiment of the invention. For example, it is also acceptable that the following (semi-additive) method is employed. A metal layer is formed on an insulation layer. Then, a resist is coated on the top surface of the metal layer, and the resist is exposed to light, and developed. As a result, a resist film having an opening for exposing a wiring formation region is formed. Then, a metal film is formed on the opening by an electroplating process, or the like, with the metal layer as a power feeding layer. Then, the resist film is removed. Then, the metal layer in the region in which the metal film is not formed is removed by etching. As a result, a wiring pattern including a metal layer and a metal film is formed.

What is claimed is:

1. A semiconductor device, comprising:
   a semiconductor substrate comprising:
      a plurality of semiconductor chip formation regions; and
      a scribe region arranged between the plurality of the semiconductor chip formation regions and including a substrate cutting position;
   a semiconductor chip comprising an electrode pad and provided on the semiconductor chip formation region;
   a protective layer provided on the semiconductor substrate and extending across the semiconductor chip formation regions and the scribe region, said electrode pad being generally flush with an upper surface of said protective layer;
   a first insulation layer provided on the protective layer and extending across the semiconductor chip formation regions and the scribe region;
   a second insulation layer provided on the first insulation layer and defining openings at the scribe region;
   an internal connection terminal provided on the electrode pad and having an upper surface that is exposed from said first insulation layer;
   a wiring pattern formed on the first insulation layer and the internal connection terminal upper surface and comprising a metal layer to be electrically connected to the internal connection terminals; and
   an external connection terminal electrically connected to the wiring pattern, wherein
   a part of the first insulation layer corresponding to the substrate cutting position of the semiconductor substrate is exposed through the opening of the second insulation layer.

2. The semiconductor device according to claim 1, wherein the first insulation layer does not expose the semiconductor chips corresponding to the scribe region.

3. The semiconductor device according to claim 1, wherein the first insulation layer is made of a non light-sensitive insulation material.

* * * * *